United States Patent
Shahar et al.

[11] Patent Number: 6,034,373
[45] Date of Patent: Mar. 7, 2000

[54] SEMICONDUCTOR RADIATION DETECTOR WITH REDUCED SURFACE EFFECTS

[75] Inventors: Arie Shahar, Moshav Magshimim; Uri El-Hanany, Rehovot; Alex Tsigelman, Petach Tikva; Alex Gorin, Rishon le Zion; Shimon Klier, Savion; Eldan Halbertal, Moshav Mazor, all of Israel

[73] Assignee: Imrad Imaging Systems Ltd., Rehovot, Israel

[21] Appl. No.: 08/988,590

[22] Filed: Dec. 11, 1997

[51] Int. Cl.⁷ .................................................. H01L 27/14
[52] U.S. Cl. ...................... 250/370.01; 250/370.08; 250/370.06; 250/338.4; 250/372
[58] Field of Search .................. 250/370.01, 370.08, 250/370.06, 338.4, 372

[56] References Cited

U.S. PATENT DOCUMENTS

| | | |
|---|---|---|
| 4,594,583 | 6/1986 | Seko et al. . |
| 4,604,611 | 8/1986 | Seko et al. . |
| 4,837,607 | 6/1989 | Kemmer et al. .................. 250/370.01 |
| 4,885,620 | 12/1989 | Kemmer et al. .................. 250/370.01 |
| 4,926,228 | 5/1990 | Ashley et al. . |
| 5,239,179 | 8/1993 | Baker ................................... 250/338.4 |
| 5,326,996 | 7/1994 | Mcnutt . |
| 5,365,069 | 11/1994 | Eisen et al. . |

FOREIGN PATENT DOCUMENTS

| | | |
|---|---|---|
| 3321921 | 12/1984 | Germany . |
| 57-201086 | 12/1982 | Japan . |
| 60-218870 | 11/1985 | Japan . |
| WO 97/14060 | 4/1997 | WIPO . |

OTHER PUBLICATIONS

P.N. Lake. UNIPOLAR CHARGE SENSING WITH COPLANAR ELECTRODES –APPLICATION TO SEMI-CONDUCTOR DETECTORS. Conference Proceedings. IEEE Symposium –Norfolk, Va., Oct. 1994. pp. 1–7.

*Primary Examiner*—Constantine Hannaher
*Assistant Examiner*—Andrew Israel
*Attorney, Agent, or Firm*—Helgott & Karas, P. C.

[57] ABSTRACT

A semiconductor detector including a substrate formed of a semiconductor material and defining two opposite facing surfaces and at least one side wall, electrodes formed on two opposite facing surfaces of the substrate, the electrodes on one of the two opposite facing surfaces including an array of mutually spaced pixellated anodes defining interstices therebetween, an electrical insulator formed on the substrate at locations in the interstices between the mutually spaced pixellated anodes, or on the side wall, or both, and an electrical conductor formed onto at least part of the electrical insulator. There is also disclosed a method for overcoming performance degradation in a semiconductor detector due to non-uniformities in an electric field.

49 Claims, 12 Drawing Sheets

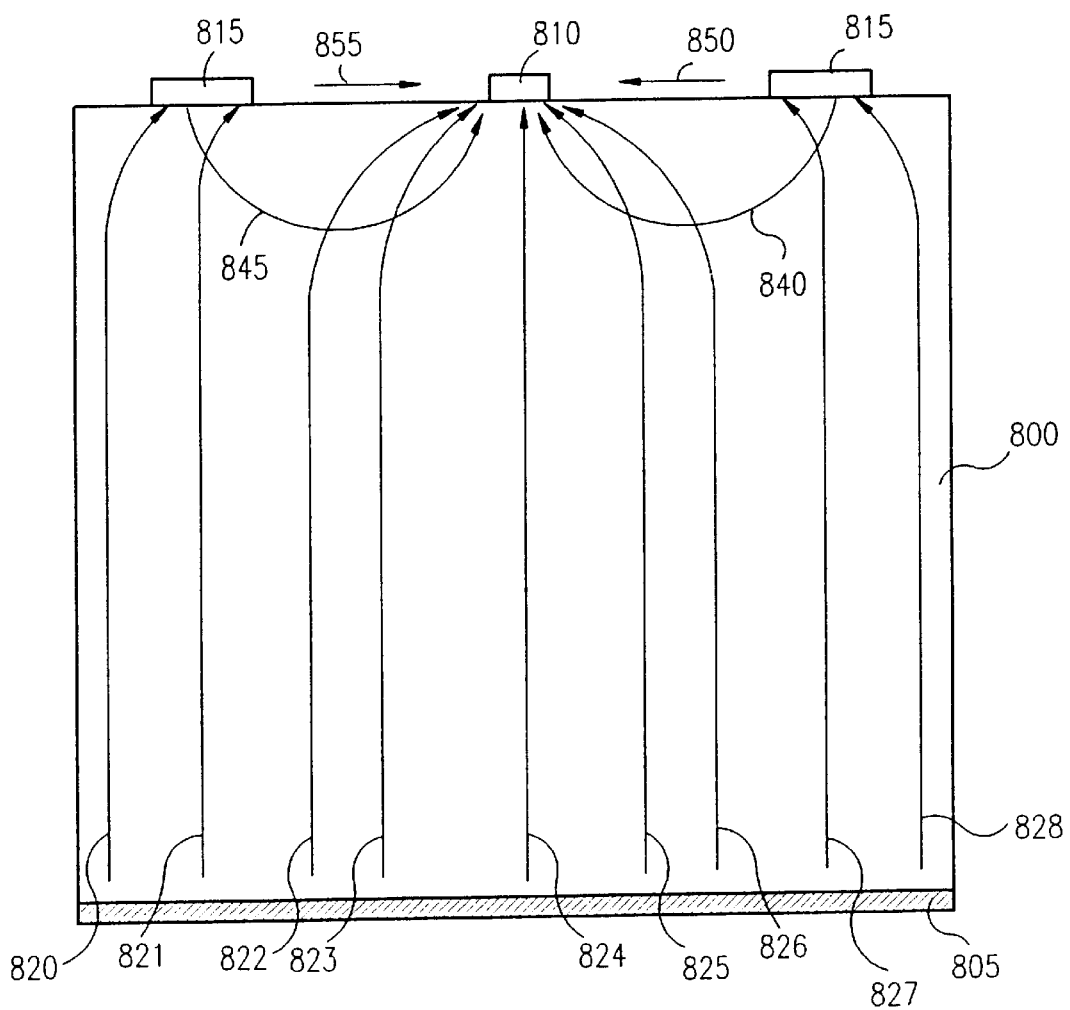

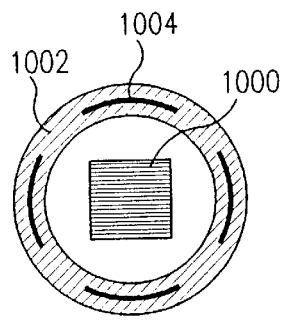
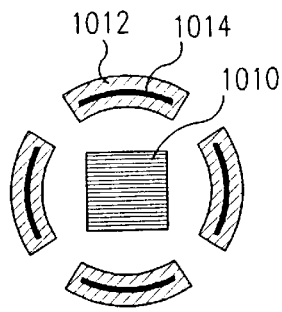
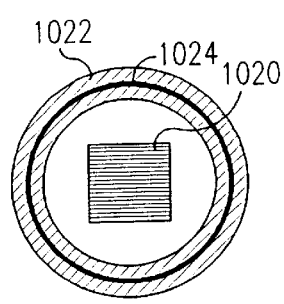
FIG. 10A  FIG. 10B  FIG. 10C
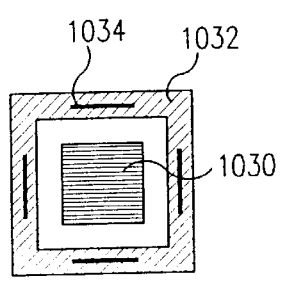
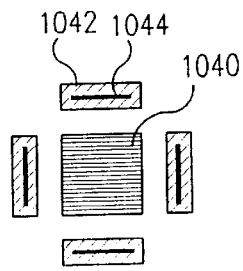
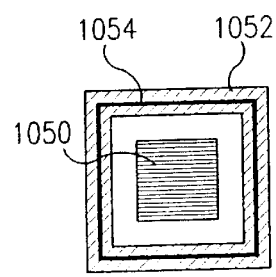
FIG. 10D  FIG. 10E  FIG. 10F

SEMICONDUCTOR RADIATION DETECTOR WITH REDUCED SURFACE EFFECTS

This application is a continuation in part of U.S. application Ser. No. 08/905,644, filed on Aug. 4, 1997, now U.S. Pat. No. 5,905,264.

FIELD OF THE INVENTION

The present invention relates to the field of radiation detectors, and more particularly to detector assemblies employed for Gamma and X-Ray imaging in the field of nuclear medicine.

BACKGROUND OF THE INVENTION

The basic structure of a semiconductor detector for ionizing radiation includes a high-resistivity semiconductor-crystal having anode and cathode electrodes. The anode and the cathode are biased to produce a strong electric field in the semiconductor crystal. A high energy photon which is oriented towards the semiconductor-detector has a certain probability of interacting with the semiconductor, which depends on its energy. This radiation-matter interaction may occur via photoelectric absorption, scattering such as Compton scattering or electron-positron pair production.

As a result of the above mentioned types of interactions between the photon and the semiconductor, the entire energy of the photon or part of it, in the case of Compton scattering, is converted to production of multiple electron-hole pairs in a form of a cloud of charge carriers. The negative charge carriers (electrons) and the positive charge carriers (holes) are caused to drift by the strong electric field in the semiconductor towards the anode and the cathode respectively.

In an ideal situation, all the electrons and holes produced in the cloud by the photon interaction, drift without loss towards the anode and cathode electrodes respectively. The drift of a charge carrier in an electric field induces in the electrodes an induced current, known as "displacement current". This current is proportional to the velocity of the charge carrier. Thus the integration of this current over the time span of the drift is proportional to the charge of the carrier and is monotonically dependent on the length of the trajectory of the charge-carrier.

In the ideal case an electron trajectory starts at the site of the photon interaction where the electron has been created and terminates at the anode, and the trajectory of the hole related to this electron (as part of the electron-hole pair) starts at the same point and terminates at the cathode. In this ideal case the total integration of the current induced on the anode and cathode will be equal to the electronic charge. Conventionally, as well known in the art, the current induced by the whole charge cloud is integrated by a Charge Sensitive Amplifier (CSA).

In the ideal case where all the electrons and holes arrive at the anode and cathode respectively, the charge integrated by the CSA connected to the anode is equal to the charge created by the photon, i.e. to Q=ne when n is the number of electron-hole pairs created by the photon, and e is the charge of one electron. Moreover, as the number n is exactly proportional to the energy of the photon, where the proportionality is a characteristic of the material, the charge induced is a true measure of the energy of the photon. Thus in the ideal case, the charge induced in the CSA, and thus the energy measured, is independent of the site of the photon interaction with the detector, i.e. it is not dependent on the distance of the interaction point from the anode. However, in practice, not all charge carriers reach their respective electrodes within the relevant integration time of the CSA.

For instance, in CdTe and CdZnTe the velocities of electrons are an order of magnitude higher than those of the holes in the same electric field. Therefore, whereas electrons drift towards the anode within a time much shorter than the "life-time", which is the typical time it takes an electron to be trapped and its trajectory to be terminated, holes are trapped on their way towards the cathode, and their trajectory stopped before they reach the cathode. Thus the induced charge is smaller than the ideal Q due to the fact that the trajectories of the holes are cut short by trapping of the holes. The resultant effect is "low-energy-tailing" due to this incomplete charge collection. This effect is dependent on the site of photon interaction. At a site near the cathode this effect will be minimal, since the holes have a small distance to travel to the cathode, whereas the incomplete charge collection problem is more severe if the photon interaction takes place nearer to the anode, since there the hole has a longer distance to travel towards the cathode.

In this situation a Multi-Channel Analyzer (MCA) spectrum, which is a graph of the number of counts vs. energy (channel), has a long low-energy-tail of events which are outside of the energy window used to accept only events which are useful for imaging. This means that in such a situation, the detector has low effective efficiency and low sensitivity and thus is unacceptable for use in imaging applications.

There are several methods known in the art which reduce the low-energy-tail effect caused by the incomplete charge collections of holes due to their low mobility.

A method which makes a detector sensitive only to electron detection is described in an article entitled "Performance of CdZnTe Coplanar-Grid Gamma-Ray Detectors", IEEE Transactions on Nuclear Science, Vol. 43, No. 3, June 1966, by P. N. Luke and E. E. Eissler. According to this method the anode side of the detector includes two coplanar sets of electrodes. One is a grid of anodes and the other is a grid of non-collecting electrodes, and the two grids are displaced relative to each other. When a charge carrier moves in the volume of the detector, it induces current in both grids. As long as its distance from the electrodes, consisting of the two grids, is much larger than the spacing between adjacent individual electrodes of the grids, the induced current is practically equal in both of the grids.

When the charge carrier approaches one of the grids, the induced current in that grid increases. If both sets of grids are maintained at the same positive potential relative to the cathode, the anode-grid, which is the collecting grid, attracts only part of the electrons, while the non-collecting grid collects the remaining part. Accordingly, such a detector is quite inefficient as only part of the photons absorbed by the detector are measured.

Luke et al. overcome this problem of the double-grid technology by negatively biasing the non-collecting grid relative to the anode grid. Consequently, in a situation when a charge carrier is in propinquity to the grid of the non-collecting electrodes, its trajectory is bent towards the anode grid, which has a higher voltage than the non-collecting electrodes, and away from the grid of the non-collecting electrodes. In this case, the induced current in the grid of the non-collecting electrodes changes polarity, until the charge carrier reaches one of the anodes of the anode grid, bringing the total induced charge in the anode to the theoretical maximum. On the other hand, the total induced charge on the grid of the non-collecting electrodes, to which this charge carrier did not get, drops to zero.

In practice the spacing between adjacent individual electrodes of the two interdigitated coplanar grids on the anode side is made much smaller than the thickness of the detector, and thus, in the majority of cases, the current induced by the holes moving along their trajectories towards the cathode, and far away from the anode, causes practically identical charge induction in the two grids. Accordingly, by using a differential CSA for subtracting the input signals of those two grids from each other, the influence of the holes may be practically eliminated, thus eliminating the low-energy-tail created by incomplete charge collection of the holes. At the same time, the detector efficiency is maintained at a good level since some of the electron-trajectories which were originally oriented towards the non-collecting grid, are deflected towards the anode grid.

The above-described method suffers from the following disadvantages:

1. The "non-collecting electrodes" are not really non-collecting electrodes, as they have good ohmic contact with the surface of the detector, so that any electrons which approach this electrode, are collected by it. As a result, a significant number of charge carriers resulting from photon-semiconductor interaction events, end up on the non-collecting electrode and do not reach the anodes. They are thus lost, without having made any contribution to the imaging system, resulting in low efficiency and sensitivity degradation.

2. The electrodes of the coplanar anode grid and of the non-collecting grid are spaced very closely, and are biased with a relatively large potential difference between them, resulting in relatively high leakage current between the anode electrodes and the non-collecting electrodes. Such leakage current introduces excess noise which broadens the energy spectrum and reduces the number of events within the energy window used for imaging, thus reducing the detector efficiency.

3. The system is electronically complicated due to the need for two sets of electrodes, and a set of corresponding differential amplifiers, and thus is not easy to implement in an imaging system having a large number of detector-cells.

4. The signal-to-noise ratio (SNR) is decreased by a factor of $1/\sqrt{2}$ due to differential amplification of the signal from two electrodes. The energy spectrum is accordingly broader by a factor of $\sqrt{2}$, which degrades the imaging quality.

A modified version of Luke's method is described in International Patent Application Number PCT/US96/15919 by B. Apotovsky et al. and assigned to Digirad Incorporated of San Diego, Calif. This application has been published as International Publication Number WO 97/14060. The inventors use a similar electrode structure to that proposed by Luke, but use the term "control electrode" instead of Luke's "non-collecting electrode". This may well be a more accurate description. As described in Luke's original article, this electrode is biased at a positive potential, and so attracts electrons, but since its potential is lower than the anode potential, part of those electrons are indeed redirected towards the anode without their being collected by the non-collecting control electrode.

The Digirad technology does differ from Luke's method in that differential charge sensitive amplifiers are not used. As a result, the only way to reduce the influence of low mobility holes (for eliminating the low-energy-tailing effect) is to increase the "small pixel effect" by reducing the anode size to a very small spot. The strong small pixel effect makes the detector sensitive only to charge carriers that are moving very close to the anode, typically within a distance of the order of the pixel size. Since the holes move towards the cathode, they will not affect the detector response. Such a small anode has a very poor collection efficiency, and the Digirad technology therefore employs the above mentioned control electrode, which assists in attracting the electrons towards the anode, in order to improve the collection efficiency.

The Digirad variation of Luke's method, therefore suffers from all the disadvantages of Luke's method described above, and from one additional disadvantage. The ratio between the anode area and the area of the control electrode is very small, resulting in even greater charge loss to the control electrode than in Luke's original method. This leads to efficiency and sensitivity degradation even more severe than that encountered in Luke's method.

The charge loss to the control electrode has been numerically calculated and measured by applicants. Both the calculations and the measurements are in agreement and show that a large amount of charge is collected by the control electrode and is lost for imaging applications. This phenomenon is demonstrated in Prior Art FIG. 1. This figure shows Multi Channel Analyzer (MCA) spectra numbers 1 and 2, taken from FIGS. 4 and 9 respectively of the above International Publication Number WO 97/14060. The spectra show the number of counts (events) as a function of channel number (energy). Spectrum 1 was measured using a conventional detector geometry, while spectrum 2 was measured in a similar sized detector cell but using the method of International Publication Number WO 97/14060. A comparison between the two spectra clearly indicates that:

1. The low-energy-tailing effect present in spectrum 1 is indeed eliminated in spectrum 2.

2. The number of events in an energy window of +/− FWHM around the peak (the energy range used for imaging) remains about the same in both of the spectra, or even decreases somewhat in spectrum 2.

This means that the Digirad technology described in International Publication Number WO 97/14060, while successful in eliminating the low-energy-tailing effect, does not convert the events removed from the spectrum low-energy-tail into useful events lying within the energy window used for imaging. Consequently, for such applications as imaging in the field of nuclear medicine, where, in order to reduce the radiation dose needed for producing the image, detector sensitivity and efficiency are of primary importance, the Digirad technology has no advantage over the traditional detectors in prior art use, such as those used for obtaining spectrum 1 in FIG. 1. The main use of the Digirad technology would therefore seem to be in Nuclear Physics applications or X-Ray spectroscopic and analysis methods such as Energy Dispersive-X Ray Fluorescence (ED-XRF), where peak to valley ratio of the detector spectrum is a more important parameter than detector efficiency.

Another method for eliminating the low-energy-tailing effect in the detector spectra, caused by the low-mobility holes, is described in the National Phase Filing of International Patent Application Number PCT/US95/09965, some of the inventors of which are applicants herein. According to this method the detector has at least one injecting electrode having a high quality ohmic contact which serves as the cathode electrode. In this case, as in the previous cases, electrons move quickly towards the anode and practically all of them arrive at the anode. Holes, on the other hand, due to their low mobility and short lifetime, can only move a small distance towards the cathode within the integration time of the CSA, and some of them are even trapped in stationary sites, However, in this case, because of the special characteristic of this detector, namely its strong electron injecting cathode, the charge imbalance created by the hole cloud within the detector induces an injection of electrons from the cathode towards the hole cloud, and annihilate holes by direct recombination. In this way, the incomplete hole trajectory is replaced by a trajectory of an electron moving from the cathode towards the holes. Therefore, the charge collection is compensated and the low-energy-tailing effect is prevented.

The above method is superior to the method of Luke and to that of Digirad Inc., since it achieves the same elimination of the low-energy-tailing effect, without count loss to a non-collecting control electrode. Prior Art FIG. 2 shows an MCA spectrum of a detector constructed according to the method described in PCT/US95/09965, as proposed by applicants. From FIG. 2 it is seen that the low-energy-tailing effect is eliminated. In addition the number of counts actually achieved in this invention is about three times greater than the number of counts measured in a similar detector with non-collecting control electrodes, but without the injecting electrode.

While the method described in PCT/US95/09965 is a marked improvement over both the Luke and the Digirad prior art described above, in that it provides an effective solution to the incomplete hole collection problem, and thus eliminates the low-energy-tailing effect, both it and the other methods discussed above still do not provide a solution to another serious detector problem, namely that of incomplete charge collection caused by surface imperfections and contamination.

Prior art conventional detectors, including those mentioned above, suffer from incomplete charge collection and performance degradation, due inter alia to non-uniformities in the electric field thereacross adjacent to the side walls thereof, and due to leakage current along the surface of the detector side walls. Detector problems arising from non-uniform electric fields, leakage currents, charge-carrier traps, charge-carrier recombination centers, conductive contamination, lattice defects and the energy levels of donors and acceptors inside the band-gap are all related not only to the presence of surface imperfections on the detector side-walls but also to surface imperfections in general, and result in performance degradation of the detector. These problems can exist at any surface of the detector, especially if it is exposed and was not previously passivated or treated by other processes to reduce surface imperfections. The above mentioned surface imperfections lead to incomplete charge collection, excessive noise and performance degradation of detectors, and to the best of the inventors' knowledge, this problem has not been effectively addressed in any prior art detectors.

The following U.S. and foreign patent documents show the provision of an external electrode for various purposes distinct and different from those of the present invention: U.S. Pat. Nos. 5,326,996; 4,926,228; Japanese Kokais 60-218870 and 57-201086 and German Offenlegungsschrift DE 3321921.

SUMMARY OF THE INVENTION

The present invention seeks to provide a semiconductor detector for ionizing radiation and an array of modular detector assemblies which overcome performance degradation due to non-uniformities in the electric field thereacross adjacent to the side walls and other surfaces of the detector, due to recombination centers and traps for charge carriers, and due to leakage current along the surface of the detector side walls and other detector surfaces.

The present invention seeks to provide semiconductor detectors having reduced charge carrier recombination and trapping, and reduced leakage current adjacent to the side walls and other detector surfaces thereof, thereby improving the charge collection efficiency, the signal-to-noise ratio and the energy resolution of the detectors.

There is thus provided in accordance with a preferred embodiment of the present invention a semiconductor detector or an array of semiconductor detectors, each detector including a substrate formed of a semiconductor material and defining first and second opposite facing surfaces, electrodes formed on the first and second opposite facing surfaces of the substrate, an electrical insulator formed on at least part of at least one of the first and second opposite facing surfaces of the substrate, and an insulated electrode formed on at least part of the electrical insulator. The electrodes on the first surface of the substrate may be in the form of an array of mutually spaced pixellated anodes, and the electrode on the second opposite facing surface would then be its corresponding cathode.

Furthermore, in accordance with this preferred embodiment of the present invention, a bias voltage is applied to the insulated electrode, inducing an electric field into the semiconductor material, such that the electrodes, the insulating layer and the insulated electrode operate generally in the manner of a gated conduction channel in the semiconductor, and influence the flow of charge carriers between the electrodes on the first and second opposite facing surfaces. This electric field attracts some of the charge carriers towards the insulated electrode and produces a space charge at the boundary between the electrical insulator and the substrate, and an electron depletion region surrounding the boundary between the electrical insulator and the substrate. This space charge deflects electron trajectories away from the electrical insulator, which is located on or near the side wall of the detector, and towards the pixellated anodes. The higher resistivity of the electron depletion layer in the region near the boundary between the electrical insulator and the substrate also assists in deflecting the electron trajectories away from the insulator area, and towards the pixellated anodes. Because of the presence of imperfections at the side wall, it is a problematic region for efficient charge carrier flow. The deflection of the charge carrier paths away from this problematic area by the combination of these effects therefore improves charge collection efficiency, signal-to-noise ratio and the energy resolution of the detectors.

There is further provided in accordance with another preferred embodiment of the present invention a semiconductor detector or an array of semiconductor detectors, as described above, and wherein electrodes are formed on the first of the first and second opposite facing surfaces of the substrate comprise an array of mutually spaced pixellated anodes defining interstices therebetween, the electrical insulator is formed on the substrate at locations substantially in the interstices between the mutually spaced pixellated anodes, and the insulated electrode is formed on at least part of the electrical insulator.

In accordance with another preferred embodiment of the present invention, the insulator in any of the above embodiments may also be formed on at least part of a side wall of a detector, and an insulated electrode formed over at least part of the electrical insulator formed on at least part of the side wall.

In accordance with a further preferred embodiment of the present invention, there is provided a semiconductor detector or an array of semiconductor detectors, as described above, and wherein the electrodes, the electrical insulator and the insulated electrode operate generally in the manner of an insulated gate conduction channel.

In accordance with a yet another preferred embodiment of the present invention, there is provided a semiconductor detector or an array of semiconductor detectors, as described above, including a side wall, an electrical insulator formed on at least part of at least one side wall, and an insulated electrode formed over at least part of the electrical insulator formed on at least part of the at least one side wall, and wherein side walls of adjacent detectors have a common insulated electrode functioning as a gate electrode, or wherein side walls of adjacent detectors have separate insulated electrodes, each functioning as a gate electrode.

Additionally, in accordance with still another preferred embodiment of the present invention, there is provided a semiconductor detector or an array of semiconductor detectors, as described above, and wherein the insulated electrode is either grounded, or is floating and electrically isolated from the substrate and the electrodes formed thereon.

There is also provided in accordance with another preferred embodiment of the present invention, a semiconductor detector or an array of semiconductor detectors, as described above, and wherein the electrode on the second of the first and second opposite facing surfaces of the substrate includes at least one cathode, and wherein the insulated electrode is substantially maintained at a potential relative to the at least one cathode, the potential being of any value and either polarity relative to the potential substantially maintained between the electrode formed on the first of the opposite facing surfaces and the at least one cathode, or between the pixellated anodes and the cathode.

There is further provided in accordance with yet another preferred embodiment of the present invention, a semiconductor detector or an array of semiconductor detectors, as described above, and wherein the insulated electrode induces an electric field through the electrical insulator into the semiconductor material, thereby producing a space charge at a boundary between the electrical insulator and the substrate, the space charge causing a shift of trajectories of charge carriers away from the region adjacent to the side wall or towards the pixellated anodes.

There is further provided in accordance with yet another preferred embodiment of the present invention, a semiconductor detector or an array of semiconductor detectors, as described above, and wherein the insulated electrode induces an electric field through the electrical insulator into the semiconductor material, thereby producing an electron depletion region surrounding the boundary between the electrical insulator and the substrate, the electron depletion region causing a shift of trajectories of charge carriers away from the region adjacent to the side wall or towards the pixellated anodes.

There is also provided in accordance with still another preferred embodiment of the present invention, a method for overcoming performance degradation in a semiconductor detector due to surface effects in a semiconductor substrate thereof, the detector comprising a substrate formed of a semiconductor material and defining first and second opposite facing surfaces, and also comprising electrodes formed on the first and second opposite facing surfaces of the substrate, the method comprising the steps of forming an electrical insulator on at least part of at least one of the first and second opposite facing surfaces of the substrate, and forming an insulated electrode on at least part of the electrical insulator.

In addition, there is provided in accordance with still another preferred embodiment of the present invention, a method for overcoming performance degradation in a semiconductor detector due to surface effects in a semiconductor substrate thereof, the detector comprising a substrate formed of a semiconductor material and defining first and second opposite facing surfaces, and also comprising electrodes formed on first and second opposite facing surfaces of the substrate, the electrodes formed on first of the first and second opposite facing surfaces comprising an array of mutually spaced pixellated anodes defining interstices therebetween, the method comprising the steps of forming an electrical insulator on the substrate at locations substantially in the interstices between the mutually spaced pixellated anodes, and forming an electrical conductor onto at least part of the electrical insulator.

In accordance with yet another preferred embodiment of the present invention, there is provided a method for overcoming performance degradation in a semiconductor detector due to surface effects in a semiconductor substrate thereof, the detector comprising a substrate formed of a semiconductor material and defining first and second opposite facing surfaces and at least one side wall, and also comprising electrodes formed on first and second opposite facing surfaces of the substrate, the electrodes formed on first of the first and second opposite facing surfaces comprising an array of mutually spaced pixellated anodes defining interstices therebetween, the method comprising the steps of forming an electrical insulator on at least part of the at least one side wall, and forming an insulated electrode over at least part of the electrical insulator formed on at least part of the at least one side wall.

There is also provided in accordance with a preferred embodiment of the present invention a method as described above and also including the step of inducing an electric field through the electrical insulator into the semiconductor material, thereby producing a space charge at a boundary between the electrical insulator and the substrate, the space charge causing a shift of trajectories of charge carriers away from the region of the side wall, and towards the pixellated anodes.

Additionally, there is provided in accordance with a preferred embodiment of the present invention a method as described above and also including the step of inducing an electric field through the electrical insulator into the semiconductor material, thereby producing an electron depletion region surrounding the boundary between the electrical insulator and the substrate, the electron depletion region causing a shift of trajectories of charge carriers away from the region of the side wall and towards the pixellated anodes.

There is yet further provided in accordance with a preferred embodiment of the present invention, a method as described above and also comprising the step of inducing an electric field from the insulated electrode through the electrical insulator into the semiconductor material, thereby attracting charge carriers towards the insulated electrode and producing a space charge at a boundary between the electrical insulator and the substrate, and an electron depletion region surrounding the boundary between the electrical insulator and the substrate, the space charge reaching a level such that the addition of further charge by the attraction of charge carriers towards the insulated electrode is such that the accumulated space charge produces an electric field having the same intensity but opposite orientation as the field creating the space charge, such that the space charge is self-regulated to produce the minimum electrical force needed to shift the trajectories of charge carriers away from the side wall and towards the pixellated anodes.

BRIEF DESCRIPTION OF THE DRAWINGS

The present invention will be understood and appreciated more fully from the following detailed description in which:

FIGS. 8B and 8C show a similar detector, but constructed according to the prior art shown in International Patent Publication Number WO 97/14060;

FIGS. 10A, 10B, 10C, 10D, 10E and 10F are illustrations of preferred detector configurations which may be employed in the detector array of FIG. 9.

DETAILED DESCRIPTION OF A PREFERRED EMBODIMENT

Figure 1:
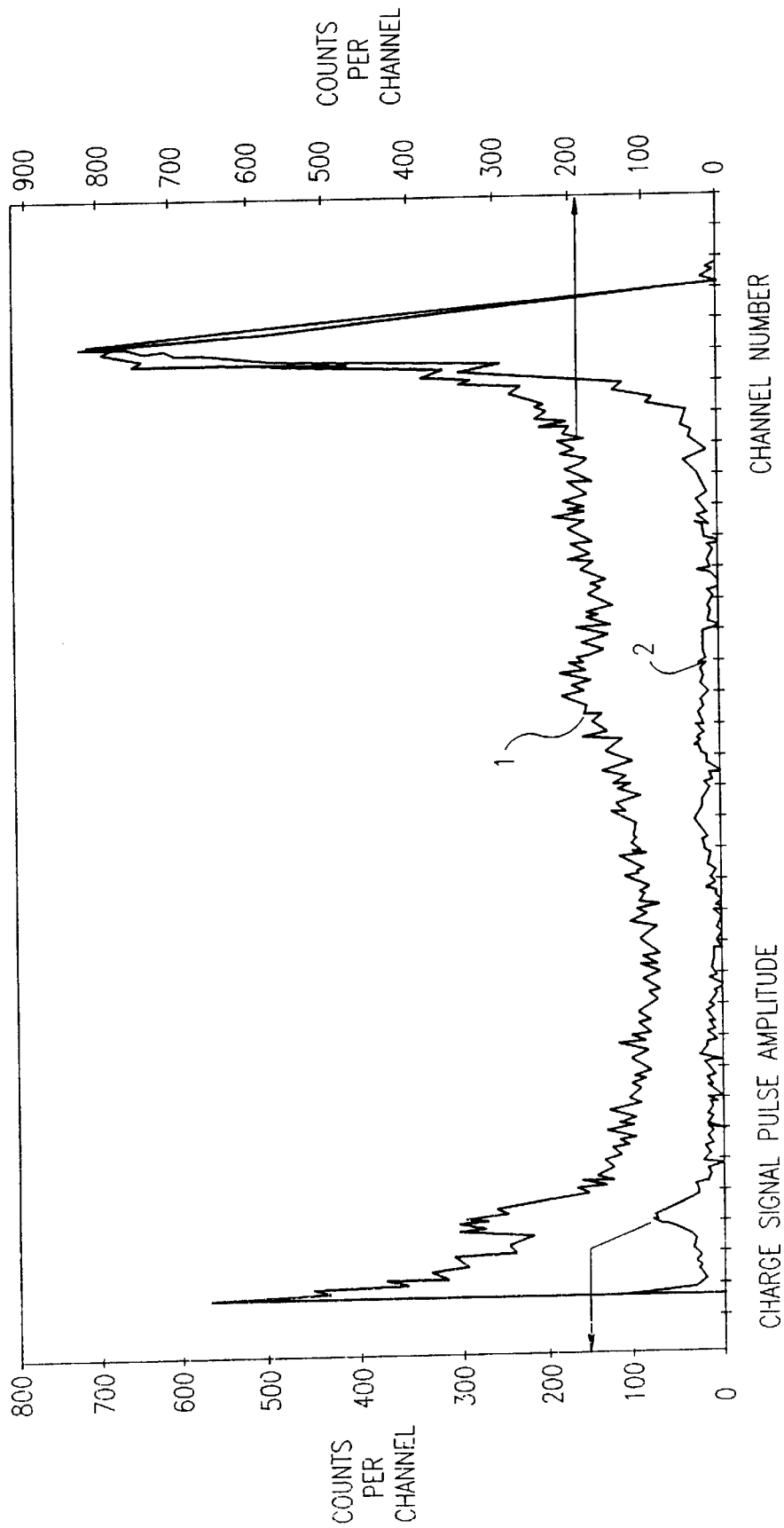
FIG. 1 shows spectra of counts vs. energy (channel) taken from FIGS. 4 and 9 of the prior art International Patent Publication Number WO 97/14060.
Figure 4:
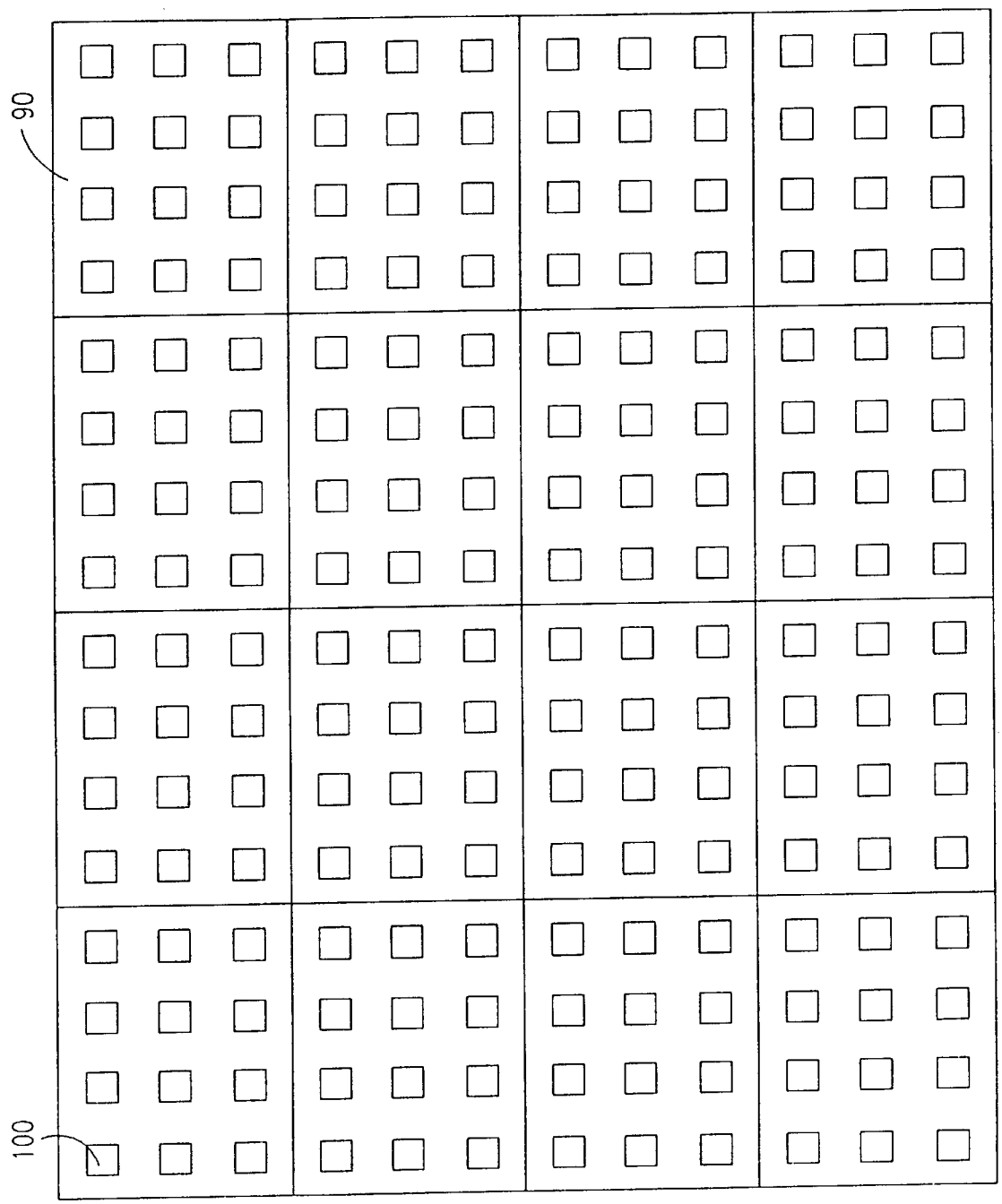
FIG. 4 is a simplified illustration of a widely used prior art detector array formed of separate detector assemblies.
Figure 9:
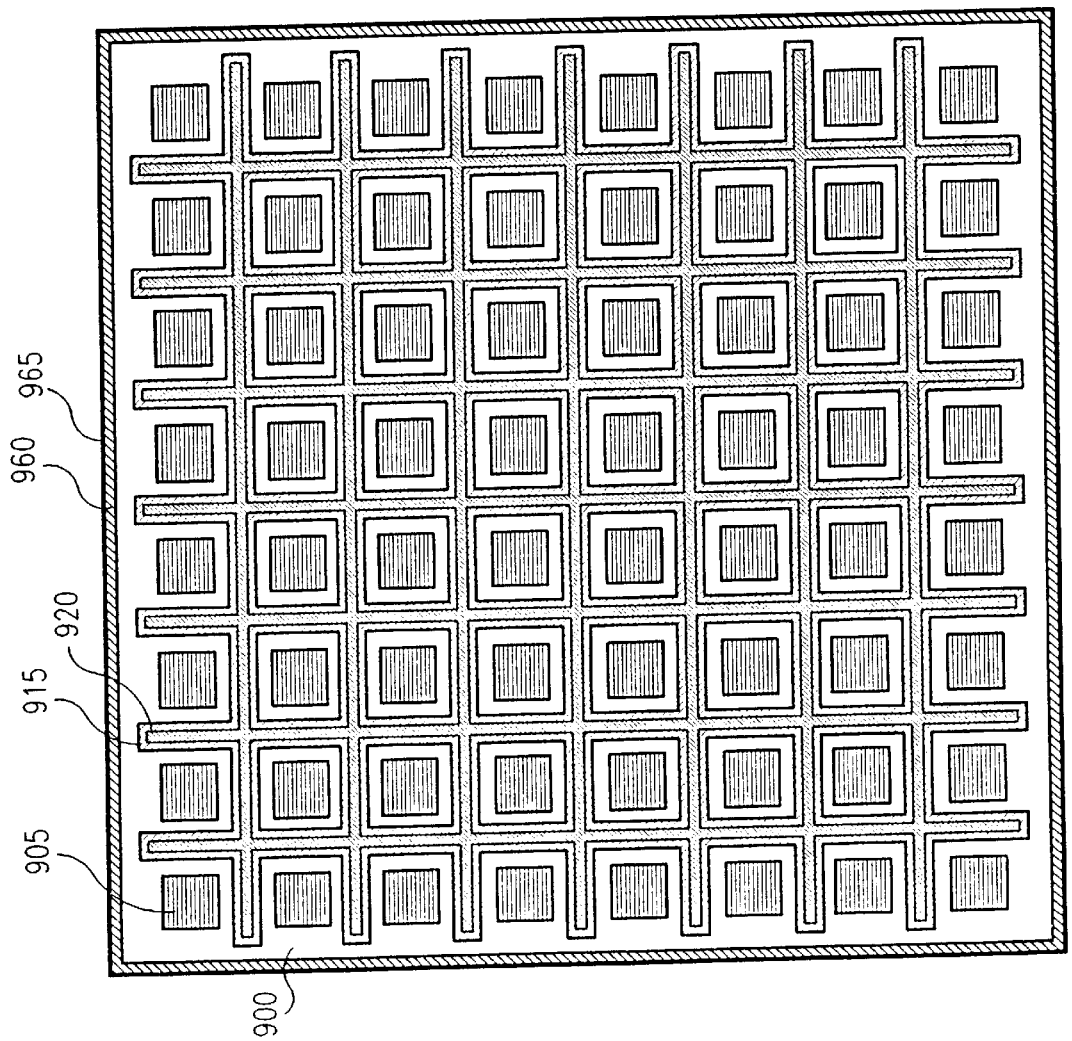
FIG. 9 is the top view of a complete detector array constructed according to another preferred embodiment of the present invention.

Reference is now made to FIG. 1, which shows spectra, labeled 1 and 2, taken respectively from FIGS. 4 and 9 of the prior art shown in International Patent Publication Number WO 97/14060, and showing the number of counts vs. energy (channel). These two spectra are shown for two detectors having similar bulk qualities. Spectrum 1 was measured by a detector having conventional electrodes. Spectrum 2 was measured by a detector having electrodes designed according to the teachings shown in Publication Number WO 97/14060. Each of the spectra has a separate coordinate for the number of counts per channel. The coordinate of counts per channel on the right relates to spectrum 1 and the coordinate on the left relates to spectrum 2.

From FIG. 1 it is clear that the low-energy-tailing effect that exists in spectrum 1 is dramatically reduced in spectrum 2 by the use of a combination of a control electrode and a small anode. If the control electrode were to have improved charge collection for the events that cause the low-energy-tailing effect, the events would have been shifted from the low-energy-tailing region in spectrum 2 to the peak region of this spectrum, and would thus have caused a dramatic increase of the total number of counts within the peak region.

It is noted, however, that comparison between the total sum of counts within the peak region in spectra 1 and 2 does not show any increase of the total number of counts within the peak region of spectrum 2. On the contrary, the comparison shows a reduction of this total in spectrum 2. This means that provision of the above-mentioned control electrodes does not result in any effective improvement in the incomplete charge collection of the events that cause the low-energy-tailing effect. Instead of shifting the counts characterized by incomplete charge collection from the low-energy-tailing region into the peak area, it simply removes those counts from the spectrum by collecting them at the control electrode and preventing them from being counted by the signal electrode, i.e. the anode. The counts that are useful for imaging in the field of nuclear medicine are only those counts within the peak.

Thus, the above mentioned method described in Publication Number WO 97/14060, though very efficient in removing the low-energy-tailing effect, does not increase the number of counts within the peak area and thus has very limited advantage in imaging applications within the field of nuclear medicine.

Figure 2:
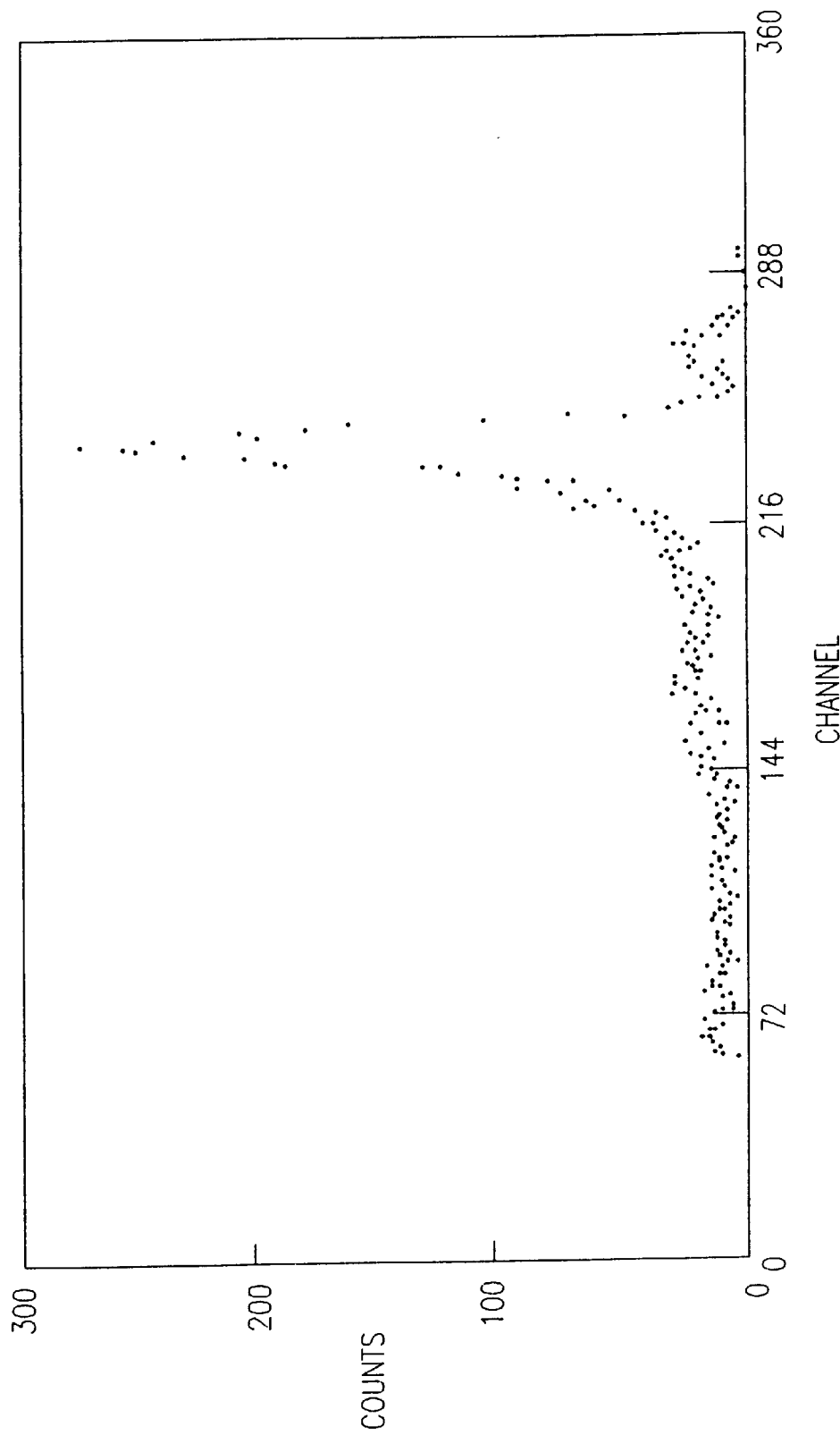
FIG. 2 shows a spectrum of counts vs. energy (channel) of a prior art detector with an injecting cathode, constructed according to the method described in International Patent Application Number PCT/US95/09965.

Reference is now made to FIG. 2 which presents an MCA spectrum of $^{57}$Co measured by a detector constructed according to the teachings of International Application Number PCT/US95/09965. This detector has a conventional geometrical electrode structure. At least one of the cathode and anode electrodes is an injection electrode. The MCA spectrum of FIG. 2 shows the elimination of the low-energy-tailing effect. As discussed below, this can be achieved while still maintaining high count efficiency at the peak area.

A comparison between measurements that were conducted under the same conditions with CdZnTe detectors constructed according to the different methods described in PCT/US95/09965 and PCT/US96/15919 (WO 97/14060) shows that while both of the methods are effective in eliminating the low-energy-tailing effect, the count efficiency at the peak area for the first method is about three times higher than the corresponding count efficiency at the peak area for the second method. This comparison proves that efficient charge collection, without count loss to the control electrode, can be achieved according to the method of PCT/US95/09965, in spite of the low mobility of the holes in CdZnTe.

While the method of PCT/US95/09965 gives a solution to the problem of incomplete charge collection due to low hole mobility, it still does not provide a solution to the surface problems as discussed above, including the problem of incomplete charge collection due to surface imperfections.

Figure 3A:
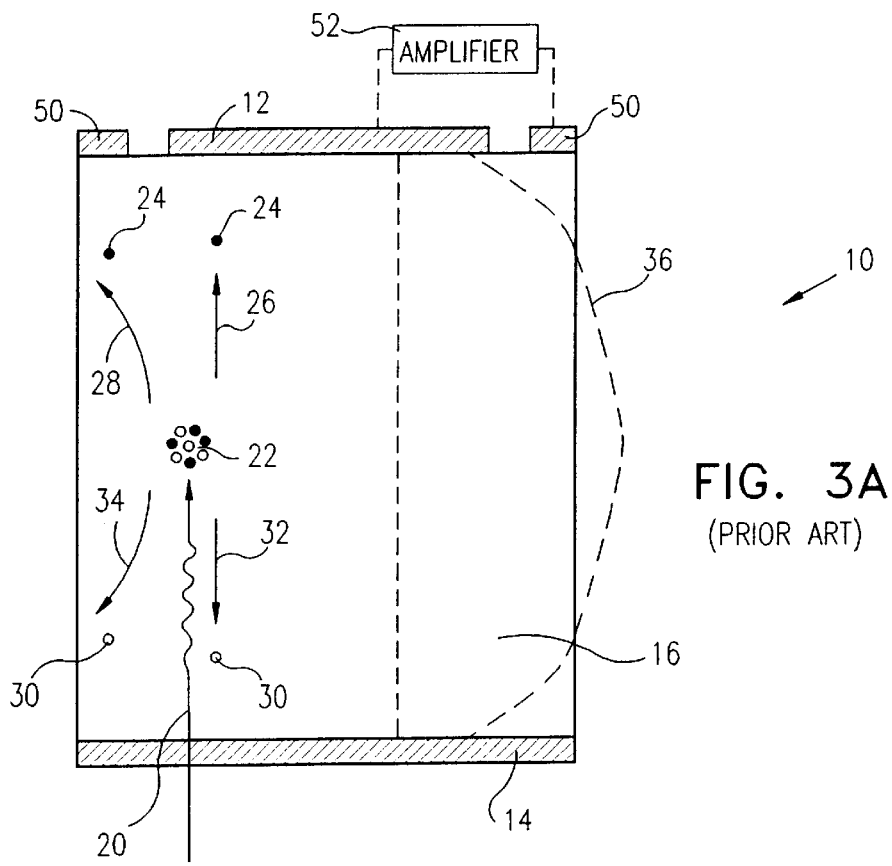
FIGS. 3A and 3B are respective side and top view simplified illustrations of a widely used prior art semiconductor detector.
Figure 3B:
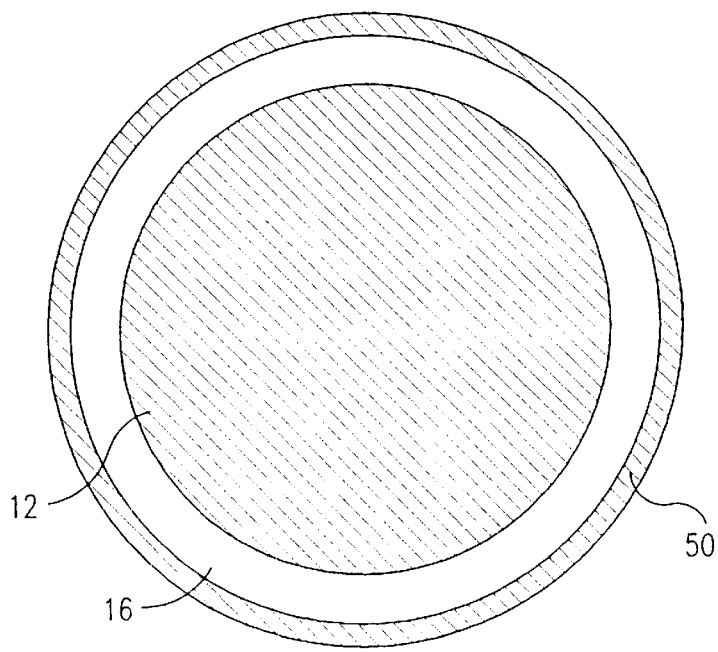

Reference is now made to FIGS. 3A and 3B, which illustrate a widely used prior art semiconductor detector 10. The detector 10 has two contact electrodes, including an anode 12 and a cathode 14 disposed along opposite surfaces of a semiconductor crystal substrate volume 16.

A photon 20 is shown inside the volume 16 of detector 10. The presence of the photon produces a charge cloud 22 of electron-hole pairs. Due to the electric field produced in volume 16 by the anode 12 and the cathode 14, electrons 24 move from the cloud 22 towards the anode 12, typical electron trajectories being indicated by arrows 26 and 28. Similarly holes 30 move from the cloud 22 towards the cathode 14, typical hole trajectories being indicated by arrows 32 and 34.

It may be readily appreciated that the trajectories of the electrons and holes in the detector volume 16 are influenced by the intensity distribution of the electric field therein and the scattering of the charge carriers as they move towards the electrodes 12 and 14. Although the scattering of charge carriers is random, being caused by defects and impurities in the semiconductor crystal, the intensity distribution of the electric field is not. The intensity distribution is non-uniform adjacent the side walls of the detector, due to the presence of a boundary between the semiconductor volume 16 and its surroundings. This is indicated by an illustrative field line 36, illustrated in FIG. 3A.

It is appreciated that in prior art detectors of the type illustrated in FIGS. 3A and 3B, charge carriers tend to collide with the side walls of the detector and be trapped and recombined with carriers of opposite charge. In such cases, the charge carriers do not contribute to the total amount of charge collected by the electrodes 12 and 14 and do not contribute to the signal output of the detector, thus reducing the efficiency and the signal-to-noise ratio of the detector. The side wall electric field non-uniformity causes the charge collection efficiency to be a function of the site of the absorption of a photon in the detector, thus reducing the energy resolution of the detector.

Leakage current also reduces the signal to noise ratio and the energy resolution of the detector. The unwanted leakage current has two components, a volume current which depends upon the voltage applied across electrodes 12 and 14 and the properties of the semiconductor substrate 16, and a surface current which passes along the side walls of the detector.

In an attempt to overcome problems of insufficient collection efficiency and surface leakage current, a guard ring 50 is provided surrounding anode 12. The guard ring 50 may be active or passive. When passive, it is biased at the same potential as anode 12. When active, an operational amplifier 52 actively maintains the potential difference between the guard ring 50 and the anode 12 at zero. Alternatively the guard ring is biased at a potential different from the potential applied to anode 12 in a manner similar to that described in Luke's article referenced hereinabove, or as described in International Patent Publication Number WO 97/14060.

The guard ring 50 is operative to collect the surface leakage current and prevent its collection by the anode, as well as to improve the uniformity of the electric field in the vicinity of the side walls of the detector. The guard ring 50 thus improves the signal-to-noise ratio and the energy resolution of the detector.

A difficulty arising from the use of a guard ring is its required width. A typical minimal width of a guard ring is about 250–300 microns for detectors having a thickness of several millimeters. This becomes important in X-ray and gamma ray imaging wherein a detector plane is formed by joining together arrays or matrixes of detectors, as illustrated in FIG. 4.

FIG. 4 illustrates part of a typical prior art detector array including typically 16 matrices 90, each containing twelve detector cells 100. The detector cells which are located along the side walls of the matrices show performance degradation similar to that described for the detectors shown in FIGS. 3A & 3B.

In view of the discussion of side wall effects hereinabove in connection with FIGS. 3A & 3B, it may be appreciated that of the twelve detector cells in each matrix 10 suffer from performance degradation due to their location at the side walls of the matrices. These degraded performance detector cells are moreover arranged in a grid pattern, which pattern then appears in the resulting image produced by the detector plane.

The use of a guard ring along the side walls of each matrix 90 may alleviate degradation in performance of the detectors along those side walls, but gives rise to another problem. The minimum spacing between the active areas of the detector cells in two adjacent matrix is larger than the spacing between two adjacent detector cells within a given matrix by twice the width of the guard ring, typically 500–600 microns. The resulting non-uniform distribution of detector cells in the detector plane too produces a grid pattern in the resulting image and is therefore objectionable.

Figure 5A:
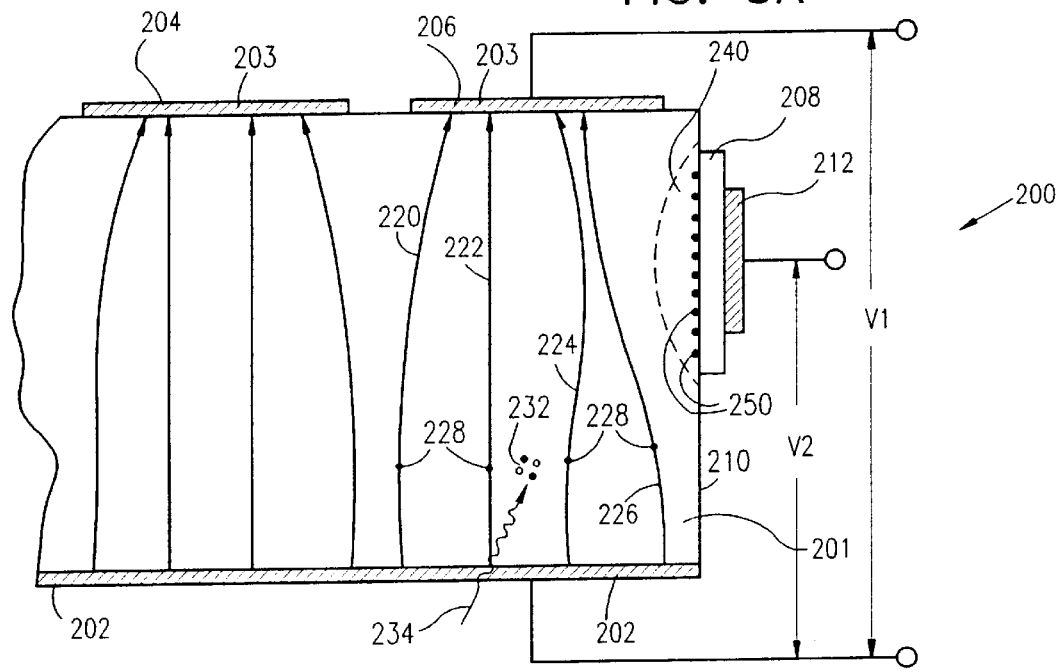
FIGS. 5A and 5B are respective side view and top view simplified illustrations of part of a detector array constructed and operative in accordance with a preferred embodiment of the present invention.
Figure 5B:
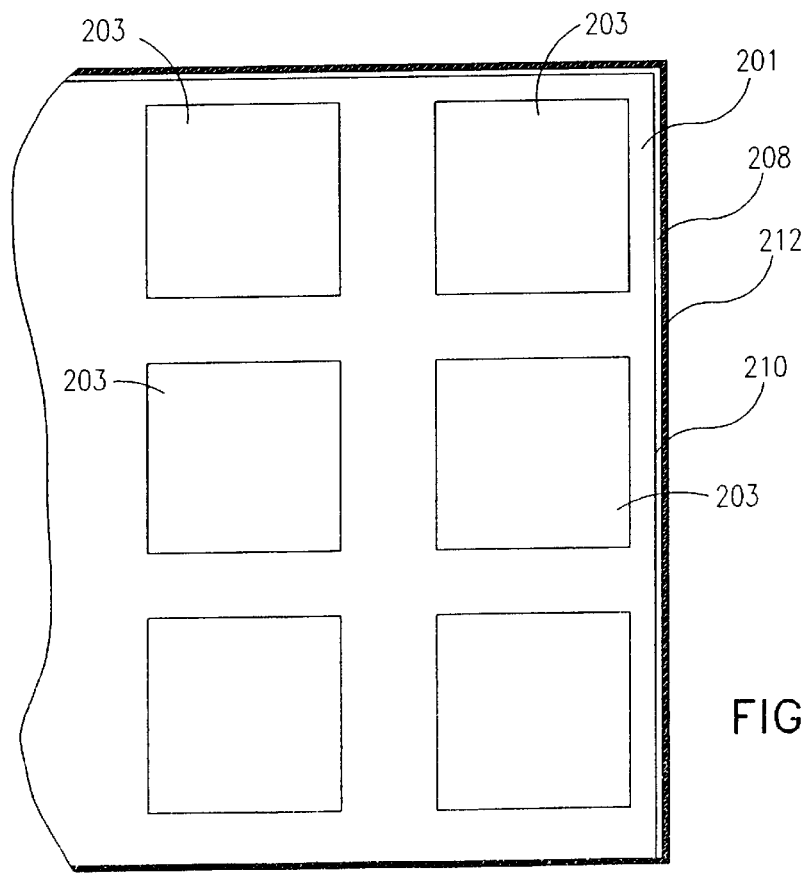

Reference is now made to FIGS. 5A and 5B, which show a cross section and plan view respectively of a portion of a detector plane matrix 200, constructed and operative in accordance with a preferred embodiment of the present invention. The detector plane 200 includes a semiconductor crystal substrate volume 201, a monolithic lower cathode 202 and a plurality of spaced anodes 203, two of which, anodes 204 and 206 are illustrated in FIG. 5A.

In accordance with a preferred embodiment of the present invention, an electrical insulating material 208, such as polyimide, is applied to a portion of the peripheral side wall 210 of the matrix 200 by conventional microelectronic fabrication methods, such as coating, evaporating, passivating, oxidizing, depositing, bonding, or even by dipping, brushing, taping or any other suitable technique. A conductor, defining an electrode 212, typically formed of metal foil, is formed over a part of the insulating material 208, by conventional microelectronic fabrication methods, such as coating, printing, evaporating, bonding, or even by taping or painting or any other suitable technique.

The insulating layer 208 and the electrode 212 may be continuous about the periphery of the matrix or formed as a plurality of discrete elements spaced from each other.

In accordance with a preferred embodiment of the present invention, and as illustrated in FIG. 5A, all of the anodes 203 are maintained at the same electrical potential V1 relative to cathode 202. Preferably, electrode 212 is maintained at a potential V2 relative to cathode 202, where, in this specific example, V2 is of the same polarity and less than V1. The illustrated embodiment of FIG. 5A is suitable for a detector made of a n-type semiconductor such as CdTe or CdZnTe where electrons have a much higher mobility than that of the holes, and the detector is irradiated with photons via the cathode 202. When a p-type semiconductor is employed, the polarities are reversed.

In accordance with another preferred embodiment of the present invention, electrode 212 is floating, is not connected to any power supply and is electrically isolated from all other components of the detector circuit. For safety reasons, anodes 203 are electrically grounded and the entire detector matrix is negatively biased. In this case electrode 212 and anodes 203 have virtually the same potential.

It is a particular feature of the present invention that electrodes 202, 203 and 212 together with insulating layer 208 on side wall 210 of the matrix 200 define a type of structure similar to a MIS- or MOSFET ( Metal-Insulator-Semiconductor, or Metal Oxide-Semiconductor Field Effect Transistor) wherein electrodes 202 and 203 serve as source and drain respectively, and electrode 212 is equivalent to the gate of the FET. Preferably a FET configuration of this type is applied to all detector cells lying along the side wall 210 of the matrix 200. It should be noted that the structure only resembles a FET in physical layout, but no amplification effects, such as are obtained in a transistor, are implied. The structure could preferably be called an insulated gate conduction channel.

In accordance with a preferred embodiment of the present invention as exemplified by FIG. 5A, when electrode 212 is biased positively, it induces an electric field through insulating layer 208 into the semiconductor volume 201. This electric field attracts the electrons from a region 240 adjacent to the side wall in semiconductor volume 201 and pulls them towards layer 208. These electrons are schematically illustrated and indicated by reference numeral 250. Electrons 250 produce a space charge at the boundary between insulating layer 208 and the side wall 210, while leaving region 240 in a somewhat electron depleted state.

Electron depleted region 240, due to its low charge carrier concentration has relatively high electrical resistivity. This dramatically reduces the leakage current in region 240 in the vicinity of the side wall 210.

Typical trajectories 220, 222, 224 and 226 of electrons drawn from charge clouds produced by impingement of multiple photons at various locations in the interior of the detector, are affected by this space charge. The electric field formed as a result of the space charge repels the electrons and thus bends their trajectories 228 such that their path is shifted away from side wall 210, as illustrated in FIG. 5A. A similar phenomenon occurs for hole trajectories when the polarities are reversed and a p-type semiconductor material is employed.

The region close to the side wall 210 has a high density of defects, because of which, charge carriers have a high probability of being trapped and recombined there. The shift of the trajectories of the charge carriers removes them from this problematic region. This increases the collection efficiency and uniformity of the detector, since the charge carrier trajectories become equally effective irrespective of the site 232 at which a photon 234 is absorbed.

It is a particular feature of the present invention that the combined effects mentioned above of reduced leakage current in the vicinity of the side wall and shifting of the charge carrier trajectories away from the side wall produce a significant improvement in the signal-to-noise ratio and in the energy resolution of the detector.

As will be explained hereinbelow with reference to FIG. 8A, it is a further particular feature of the present invention that the above mentioned performance enhancements may be realized regardless of whether electrode 212 is biased positively, negatively, electrically floating or maintained at ground potential. It should be again stated that in the present invention, the side wall MIS FET type of structure is not designed to control the channel current for amplification purposes but rather is intended to reduce unwanted side wall effects. It does so for any suitable bias value and polarity of the gate electrode 212.

Figure 6A:
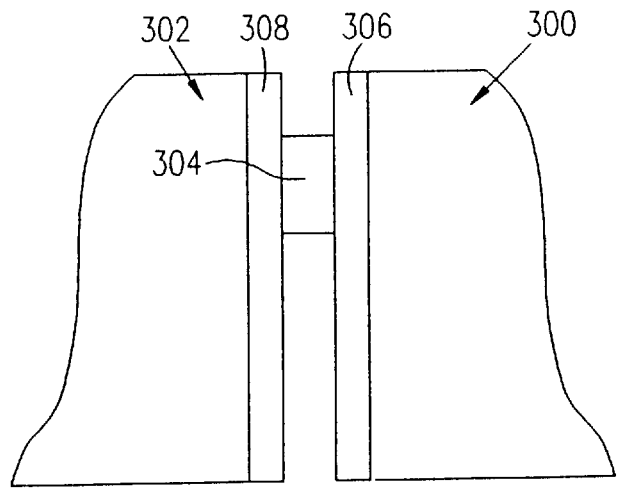
FIG. 6A is a simplified side view illustration of the interface between two adjacent modular detectors having a common conductor.
Figure 6B:
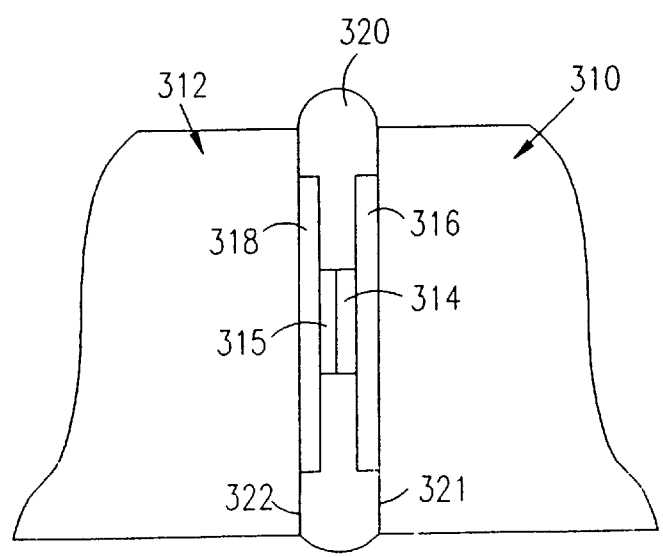
FIG. 6B is a simplified side view illustration of the interface between two adjacent modular detectors having separate conductors.

Reference is now made to FIGS. 6A and 6B which illustrate two alternative side wall electrode arrangements useful in accordance with the present invention.

FIG. 6A illustrates one embodiment of attachment between two adjacent modular detector matrices 300 and 302. Here a single gate-like electrode 304 is disposed between two side wall insulating layers 306 and 308 and thus serves both adjacent detectors 300 and 302 in a manner described hereinabove.

FIG. 6B illustrates another embodiment of attachment between two adjacent modular detectors 310 and 312. Here a pair of gate-like electrodes 314 and 315 are provided, each being associated with a corresponding insulating layer 316 and 318. Such a structure may be achieved, for instance, when insulating layers 316 and 318 are made of double sided sticky tape, such as the tape produced by The 3M Company. One of the sides of the tape is taped to the side walls of the semiconductors and the other side is taped to metal foils which serve as electrodes 314 and 315.

Insulating material 320 may be provided in the interstices between adjacent side walls 321 and 322 of adjacent detector matrices.

Figure 7A:
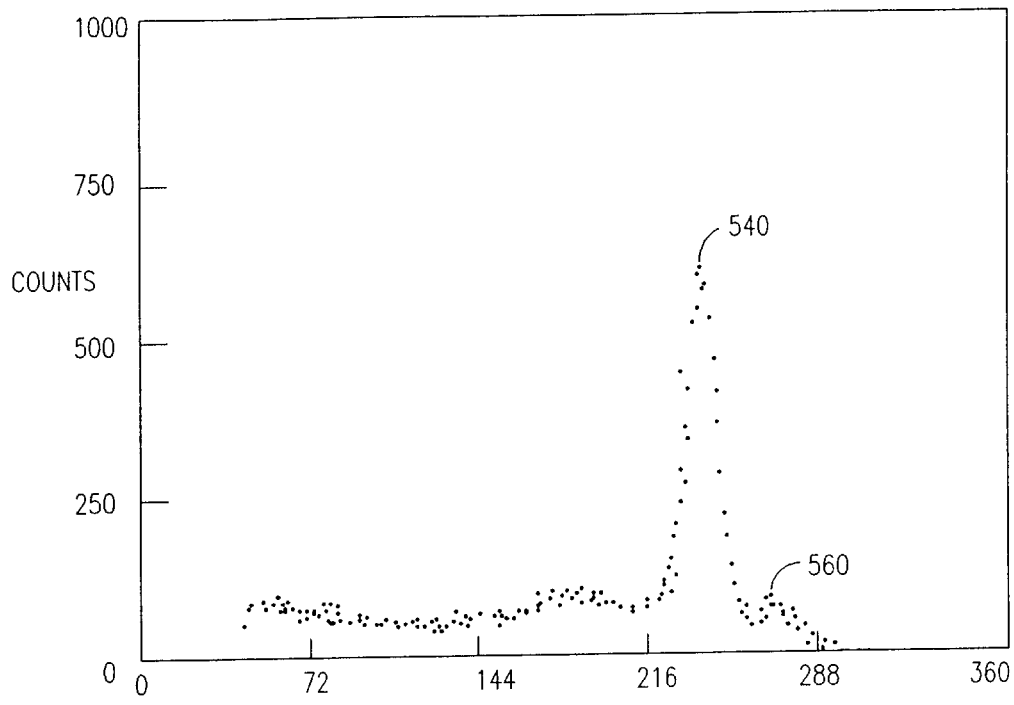
FIGS. 7A and 7B are illustrations of spectra obtained respectively from a detector constructed and operative in accordance with a preferred embodiment of the present invention, and from a widely used conventional prior art detector.
Figure 7B:
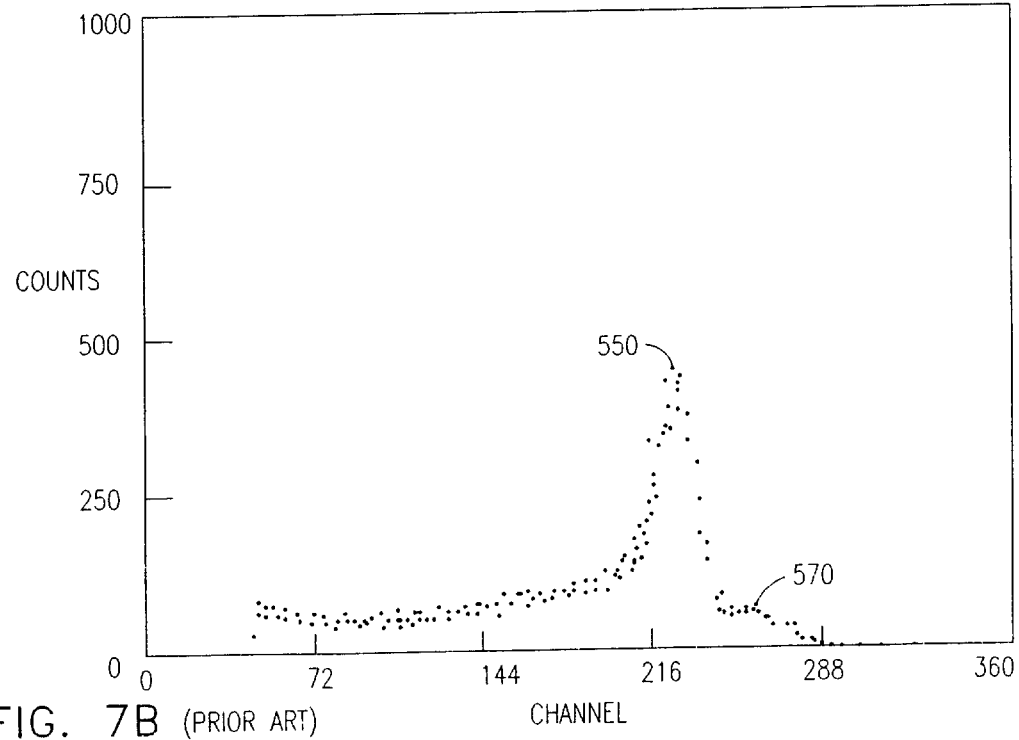

Reference is now made to FIGS. 7A and 7B which show measured pulse height spectra for a CdZnTe detector cell for $_{27}Co^{57}$ (122 KeV—87% and 136 KeV—9% gamma ray radiation). The detector is a corner detector cell in a matrix having two side walls. FIG. 7A shows the spectrum for a configuration wherein the cell is provided with a gate-like insulated electrode, such as insulated electrode 212, along its two side walls, and FIG. 7B shows the spectrum for a configuration wherein the otherwise identical cell is not provided with such an insulated electrode. In order to assess the difference in performance between these two cases, the following parameters of the spectra of FIGS. 7A and 7B are compared:

location of the peaks (channel number) width of the peaks;

number of counts in the peaks;

the peak to valley ratio; and the spectral resolution.

It is seen that the peaks 540, 560 in FIG. 7A, are located at higher channel numbers, are narrower, have a greater number of counts, have a higher peak to valley ratio and a better resolution than the corresponding peaks 550, 570 in FIG. 7B.

The provision of gate-like insulated electrodes in accordance with the present invention results in a detector having enhanced collection efficiency, an improved signal-to-noise ratio, a collection efficiency that is less dependent on the absorption location of photons, and a lower leakage current than a similar prior art detector without such electrodes. The resulting detector has performance enhanced to a level which is generally indistinguishable from that of a detector having no side walls at all.

Figure 8A:
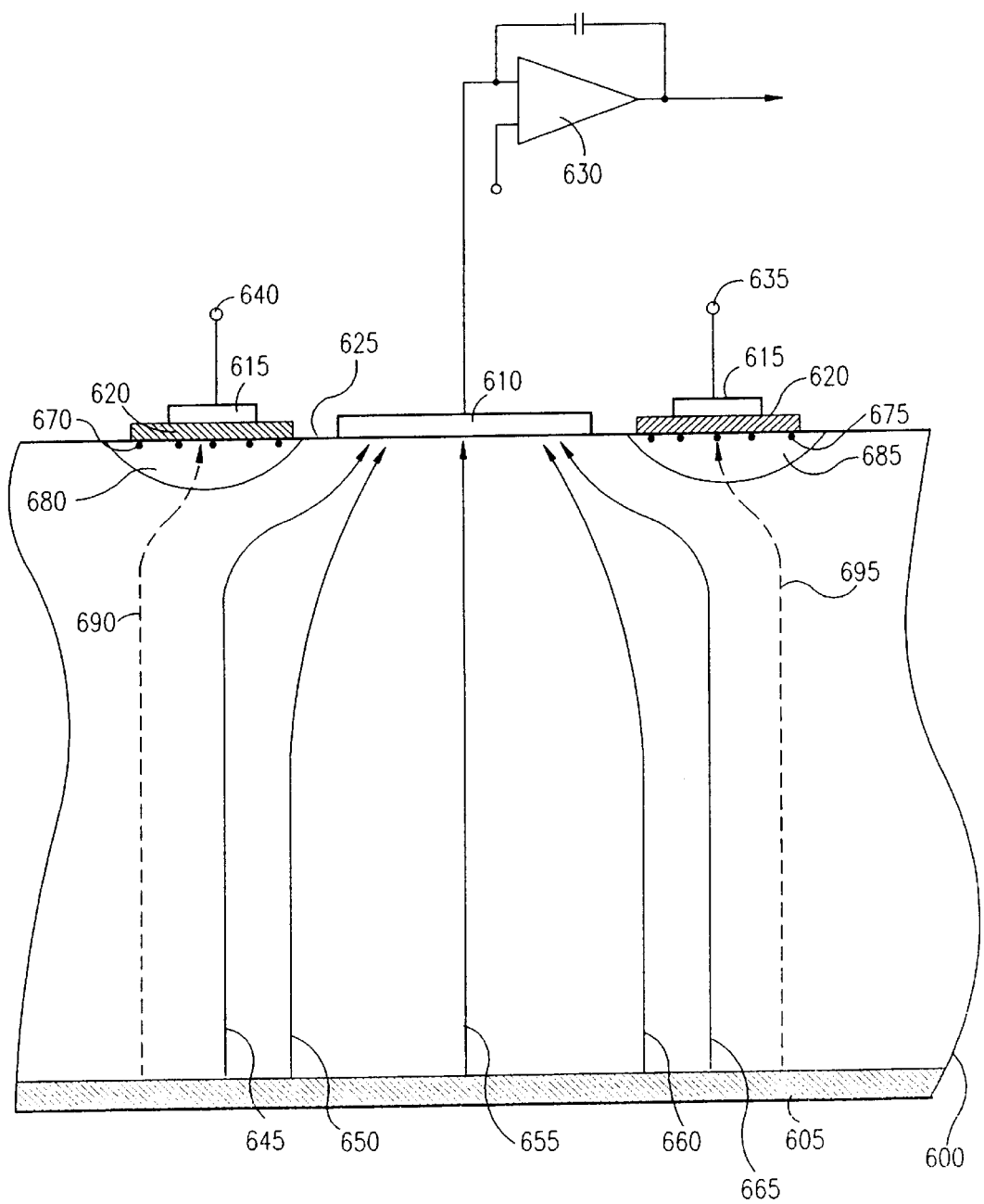
FIG. 8A illustrates the cross section of part of a detector array constructed and operative in accordance with a preferred embodiment of the present invention.

Reference is now made to FIG. 8A, which is a schematic drawing of the cross-section of one pixel of a detector constructed and operative according to another preferred embodiment of the present invention, showing the electron trajectories within the detector pixel. Detector 600 comprises a cathode electrode 605, an anode electrode 610 and an insulated electrode 615, which is provided on at least part of an insulating layer 620 formed on at least part of the detector surface 625. Anode 610 is maintained, for convenience, at ground potential and cathode 605 is biased negatively. The potential difference between anode 610 and cathode 605 produces an electrical field across the bulk of detector 600.

The general mechanism by which anode 610 and cathode 605 operate to detect incoming photons is similar to that described in the prior art. Electron-hole pairs of charge carriers created by absorption of a photon (not shown) in the bulk of detector 600, are initially concentrated in a form of charge cloud. The holes drift under the influence of the electrical field in the bulk of the detector 600 towards cathode 605, and the electrons drift under the influence of the same electrical field towards anode 610. These drifts of charge carriers induce a displacement current in the anode and cathode. Integration over time of this displacement current by a Charge Sensitive Amplifier 630 results in a charge equal to the theoretical value Q mentioned above in the Background of the Invention section, this charge being proportional to the absorbed photon-energy.

Lines 645 to 665 schematically illustrate the field lines and electron trajectories in the direction of anode 610. When insulated electrode 615 is positively biased relative to cathode 605, it creates lines of electrical field oriented towards it, such as those illustrated by broken lines 690 and 695. Some of the electrons of the leakage current, which, before the impact of any photons, is the dark current present in the detector bulk, therefore drift towards insulated electrode 615. The electrons that move along trajectories such as 690 and 695 cannot reach the electrode 615 itself, as they are stopped on reaching the insulating layer 620. These electrons are accumulated at the boundary between insulating layer 620 and the bulk of detector 600 along the interface over part of surface 625. They are shown schematically as charges 670 and 675.

These accumulated charges create a space-charge in the boundary regions and leave the nearby surrounding regions 680 and 685 depleted of charges. Both the negative polarity of the space charge and the high resistivity of the depletion regions cause the electron paths to bend away from electrode 615 and its insulating layer 620. The accumulation of the space charge and the creation of depletion regions 680 and 685 is completed very quickly during the transient period, in which the detector bias is turned on and produces initial leakage current.

The above process stops when the accumulated charge is large enough to produce an electrical field having the same intensity but opposite orientation as the electric field that creates the space charge. The kinetics of the entire process reach steady-state when the complete electronic system, comprising electrode 615, its insulating layer 620, depleted regions 670 and 675, the bulk volume of detector 600, the electric field in the bulk, and the space charge at the boundaries between insulating layer 620 and detector 600, is stabilized in a condition with the electrical forces acting on the electrons moving to and from the surface in equilibrium.

This means that a self-regulating process occurs in which the deflection force of electrons from the surface is set automatically to the minimum force needed to assure deflection of all the electrons from the surfaces of the detector 600. This self-regulating process assures maximum collection efficiency that can be achieved, since the effect of surface problems are eliminated by deflecting the electrons away from the surface.

When insulated electrode 615 is electrically floating, the lines of the electrical field in detector 600 close to insulated electrode 615 are oriented normal thereto. The electrical field is normal to the insulated electrode since the parallel component of the field inside the insulated electrode is zero and the field is continuous at the boundary. Thus the only component of the electrical field is its normal component. In this situation the electrical field produced by the bias between anode 610 and cathode 605, which is distributed in the detector volume 600, is oriented towards insulated electrode 615, and thus produces in the proximity of the surface boundary layer a space charge accumulation, in the same way as explained above in the situation when insulated electrode 615 is positively biased.

When insulated electrodes 615 are negatively biased relative to cathode 605, by applying negative voltage to terminals 635 and 640, an electrical field is induced through insulator 620 into the bulk of detector 600. This electrical field directly deflects electrons away from the boundary surface between insulator 620 and detector 600 and produces regions 670 and 675 which are electron-depleted. The combined effect of the negative electric field and the depletion layer is to cause the electron trajectories to bend away from the area on the surface of detector 600 where insulator 620 and insulated electrode 615 are positioned, and to direct them towards the anode 610.

Accordingly, it is seen that the effect of electrode 615 and its insulator 620 is to deflect electrons away from that portion of the surface of detector 600 in their immediate vicinity, irrespective of whether insulated electrode 615 is electrically grounded, electrically floating, positively biased or negatively biased. It is thus appreciated that this preferred embodiment of the present invention, besides eliminating the low-energy-tailing effect without detracting from detector efficiency, also overcomes the surface-related problems resulting from imperfections in or close to the surface containing the anodes in prior art detectors, such as incomplete charge collection, recombination centers, traps, and excess leakage current. Furthermore, it is equally suitable for use with detectors made of n-type or p-type materials.

Figure 8B:
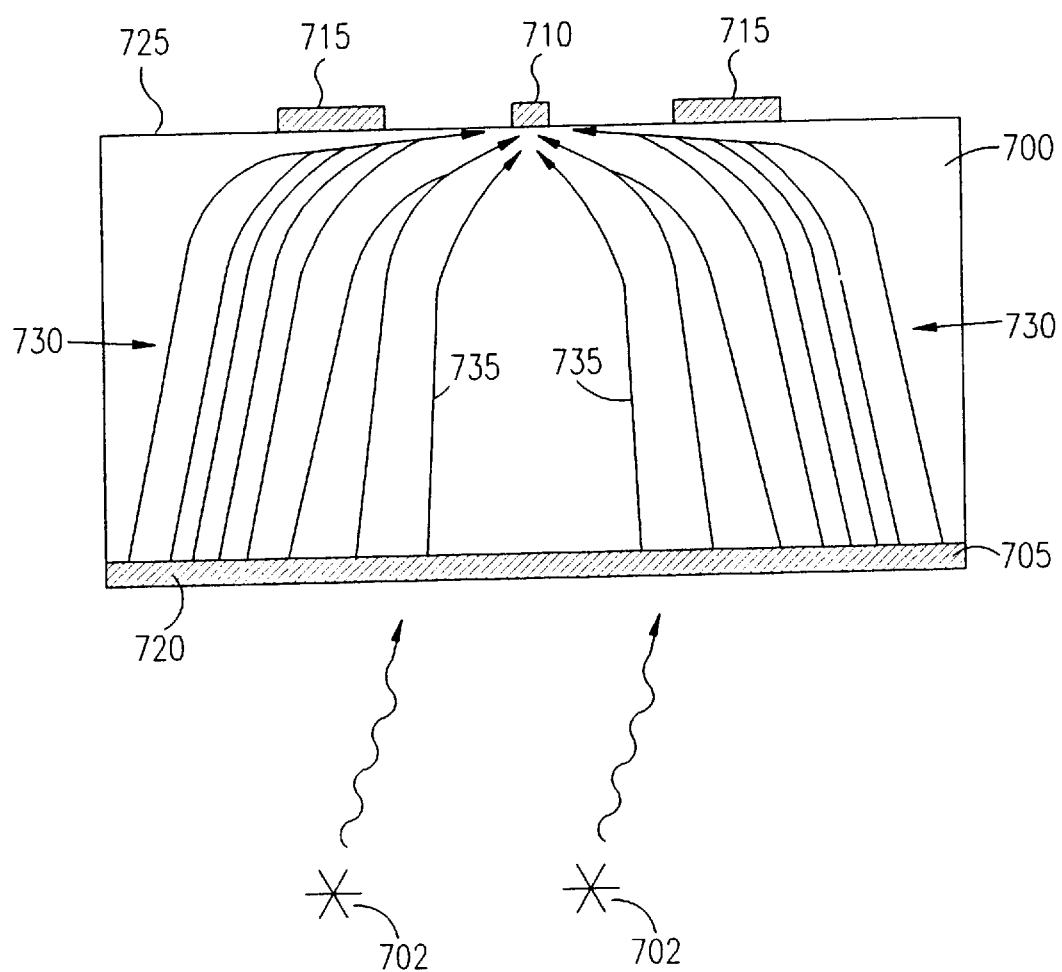

Reference is now made to FIG. 8B, which is a schematic illustration of the cross-section of a prior art detector as described in International Patent Publication Number WO 97/14060, and is identical to FIG. 5B of that publication. This prior art drawing is brought here for comparison with FIG. 8A, to demonstrate the advantages of the present invention over the technology described in International Patent Publication Number WO 97/14060.

The detector 700 is irradiated from radiation sources 702, and has lower and upper surfaces 720 and 725, respectively. Cathode 705 is formed on the lower surface 720. Signal electrode 710, which is a point-like anode, and control electrode 715 are both applied to the upper surface 725. Signal electrode 710 and control electrode 715 are both biased positive relative to cathode 705, the voltage on signal electrode 710 being about twice the voltage on control electrode 715. Lines 735 are claimed by the applicants of this prior art patent to schematically represent the distribution of electrical field 730 inside the detector 700, and hence, the trajectories along which the electrons drift.

The electron trajectories shown in the prior art FIG. 8B are, in the opinion of the present applicants, only a partial and simplified representation of the true situation existing in such a detector. FIG. 8C is a schematic illustration of the prior art detector shown in FIG. 8B, but drawn to include further types of electron trajectories which, in the opinion of the applicants, are present in the detector. In order to simplify comparison between them, FIG. 8C is drawn to similar proportions to FIG. 8A, which illustrates a detector according to a preferred embodiment of the present invention. Like FIG. 8B, the detector shown in FIG. 8C has a cathode 805, a point-like anode 810 and a control electrode 815. Cathode 805 is biased negatively relative to anode 810 and control electrode 815 is biased at a potential within the range of potentials of cathode 805 and anode 810, and in the case of the embodiment described in International Patent Publication Number WO 97/14060, at about half the potential of the anode 810.

Anode 810 is very small, in order to produce a strong "small-pixel effect". The area of anode 810 is so small that it cannot efficiently attract the electrons by itself. Accordingly control electrode 815 assists anode 810 in attracting the electrons. The electron trajectories along which the electrons drift under the influence of the electric field produced by anode 810 and control electrode 815 are schematically shown, according to the present applicants, by lines 820 to 828. Three types of trajectories are shown, as compared with only one type in FIG. 8B:

The first type of trajectories are those affected mainly by anode 810. Because of the small dimensions of anode 810, there are very few trajectories of this type and they are illustrated by line 824.

The second type are those affected by both anode 810 and control electrode 815. Electrons which move along these trajectories in the vicinity of control electrode 815 are eventually collected by anode 810, which is biased at a higher potential than control electrode 815. Such trajectories are illustrated by lines 822, 823, 825 and 826. These are the only type of trajectories which were shown in FIG. 8B, taken directly from FIG. 5B of the prior art publication.

The third type are trajectories that are mainly affected by control electrode 815 and terminate thereat. Such trajectories are illustrated by lines 820, 821, 827 and 828.

While the effect of trajectories of the first type can be neglected due to their small number, the trajectories of the third type certainly cannot be ignored. This has been proved by the applicants by means of theoretical trajectory tracing calculations, and also by means of experimental measurements on detectors with configurations similar to those of FIGS. 8B and 8C herein and FIG. 5B of International Publication Number WO 97/14060. The numerical calculations were carried out with the aid of the Simion pc/ps2, Version 4.0 software package, available from Idaho National Engineering Laboratory. The results of the measurements and the calculations are in agreement, and show that a large fraction of the electrons are collected by control electrode 815, typically 40% to 60% depending on the exact geometrical configuration and the relative position of the electrodes. These electrons are thus not collected by the signal electrode, anode 810, and are effectively lost to the measurement.

In practice, as explained in the Background section, the incomplete charge collection problem that causes the low-energy-tailing effect in the MCA spectrum, arises in the main because of photon absorption closer to the anode, and the trajectories of the electrons arising from these events begin close to the anode. They are therefore more likely to be affected by their proximity to the control electrode 815 and to be collected by it without contributing to the number of counts at the peak area of the spectrum, than electrons beginning at photon absorptions distant from the anode. It can therefore be stated that the electrons arising from most of the events which cause low-energy-tailing are lost, and do not contribute to the image count. Consequently, the use of a control electrode, such as electrode 815 in the prior art, has no advantage for nuclear medicine applications. Such prior art detectors, as illustrated in FIG. 8C, are thus considerably less efficient than detectors constructed according to the present invention, as shown in FIG. 8A.

A further disadvantage of the prior art detector shown in FIG. 8C arises because the potential difference between anode 810 and control electrode 815, which are very close to each other, produces relatively high leakage current, resulting in excess noise. This broadens the spectrum and causes a degradation of the energy resolution. The excess leakage current has bulk components illustrated by arrows 840 and 845 and surface components illustrated by arrows 850 and 855. In addition, electrode 815 acts to attract the electrons towards the detector surface and thus intensifies the above-mentioned surface problems.

There are a number of distinct physical and functional differences between insulated electrode 615 of FIG. 8A, and control electrode 815 of FIG. 8C. A summary of these differences shows the very significant advantages to a detector constructed according to the present invention, as compared with a detector constructed according to the prior art described in International Patent Publication Number WO 97/14060. These differences can be summarized as follows:

Physical differences:

Insulated electrode 615 is formed on top of an insulating layer applied to the detector surface, whereas control electrode 815 is formed directly on the surface of the detector.

Insulated electrode 615 is electrically isolated from the detector surface, whereas control electrode 815 makes direct electrical contact with the surface of the detector.

Insulated electrode 615 can be electrically grounded, floating or biased at any potential and polarity, whether for n-type or p-type detector bulk. Control electrode 815, on the other hand, must be biased within a range between the potentials of the cathode and the anode, and its polarity must be reversed when the bulk material of the detector is changed from n-type to p-type.

Functional differences:

Insulated electrode 615 deflects electrons from the detector surface and thus eliminates the surface problems mentioned above, whereas control electrode 815 attracts electrons towards the detector surface and thus intensifies the surface problems mentioned above.

Insulated electrode 615 may operate with a relatively large anode such as the one shown in PCT/US95/09965, while still eliminating the low-energy-tailing effect due to low hole mobility. The large area of the anode provides a strong attraction force, which produces high collection efficiency despite the deflection force of insulated electrode 615. Furthermore, insulated electrode 615 is self-regulating to produce the minimum deflection force needed to deflect all of the electrons from the detector surface. Control electrode 815 on the other hand, operates with a spot-like anode and thus must produce a strong attraction force, resulting in a strong collection of electrons by the control electrode 815 also. This in turn results in low charge collection efficiency by the anode, resulting in a poor count efficiency.

Insulated electrode 615, being electrically isolated from the detector surface, does not produce any leakage current, whereas control electrode 815 produces a relatively strong leakage current, resulting in peak broadening and degradation of energy resolution.

Reference is now made to FIG. 9 which is a top view illustration of an array of detectors constructed and operative in accordance with a further embodiment of the present invention. FIG. 9 shows a detector plane 900 having anodes 905 distributed uniformly in separate pixels. An insulating layer 915 is applied over plane 900 to produce a grid in the interstices between adjacent pixellated anodes 905. An electrode structure 920 is formed on at least part of insulating layer 915. This grid of insulated electrodes is operative in the same way as the insulated electrodes 615 of FIG. 8A, in overcoming surface-related problems resulting from imperfections in or close to the surface containing the anodes.

It is seen that the array of detectors is surrounded by a peripheral band 960 of insulating material, which may be identical to the material constituting insulating layer 915. An electrode 965 may be formed over part of the band 960. It is noted that both insulating band 960 and electrode 965 are shown to be continuous, it being appreciated that alternatively either or both of insulating band 960 and electrode 965 may be non-continuous. The function of this band of insulated electrode 965 is to deflect electron trajectories from the side walls of the detector array towards the anodes of the outer rows of pixelated detector elements, in order to avoid surface effects arising from the side walls and the top surface edge of the detector. This band is thus an alternative to the side wall insulated electrode 212 shown in FIG. 5A.

It is further appreciated that anodes 905, insulating layer 915 and electrodes 920 may have a wide variety of configurations. Several such embodiments are shown in FIGS. 10A–10F.

Referring now to FIG. 10A, a square anode 1000 is shown surrounded by a circular insulating layer 1002 having formed thereon a non-continuous electrode 1004.

FIG. 10B shows a square anode 1010 surrounded by a non-continuous circular insulating layer 1012 having formed thereon a non-continuous electrode 1014.

Referring now to FIG. 10C, a square anode 1020 is shown surrounded by a circular insulating layer 1022 having formed thereon a continuous electrode 1024.

FIG. 10D shows a square anode 1030 surrounded by a continuous square insulating layer 1032 having formed thereon a non-continuous electrode 1034.

Referring now to FIG. 10E, a square anode 1040 is shown surrounded by a non-continuous insulating layer 1042 having formed thereon a non-continuous electrode 1044.

FIG. 10F shows a square anode 1050 surrounded by a continuous square insulating layer 1052 having formed thereon a continuous electrode 1054.

It is appreciated that non-square anodes may also be employed.

The insulated electrodes shown in any of FIG. 9 and FIGS. 10A to 10E may be electrically grounded, electrically floating or electrically biased at any potential and either polarity.

It will be appreciated by persons skilled in the art that the present invention is not limited by what has been particularly shown and described hereinabove. Rather the scope of the present invention includes both combinations and subcombinations of the various features described hereinabove as well as variations and further developments thereof which would occur to a person of skill in the art upon reading the foregoing description and which are not in the prior art.

We claim:

1. An array of at least one semiconductor detector, at least one detector thereof comprising:
    a substrate formed of a semiconductor material and defining a detector surface comprising first and second opposite facing surfaces and at least one side wall;
    electrodes operative as anodes and cathodes of said detector formed on said first and second opposite facing surfaces, said electrodes forming a potential gradient essentially between said first and second opposite facing surfaces;
    an electrical insulator formed on at least part of said detector surface; and
    an insulated electrode of essentially conductive material formed on at least part of said electrical insulator.

2. An array of at least one semiconductor detector according to claim 1, and comprising:
    an array of mutually spaced pixellated anodes defining interstices therebetween, formed on first of said first and second opposite facing surfaces of said substrate; and
    an electrical insulator formed on said substrate at locations substantially in the interstices between said mutually spaced pixellated anodes.

3. An array of at least one semiconductor detector according to claim 2, and comprising:
    an electrical insulator formed on at least part of said at least one side wall; and
    an insulated electrode formed over at least part of said electrical insulator formed on at least part of said at least one side wall.

4. An array of at least one semiconductor detector according to claim 3, and wherein said electrodes, said electrical insulator and said insulated electrode operate generally in the manner of an insulated gate conduction channel.

5. An array of semiconductor detectors according to claim 3 and comprising at least one pair of adjacent detectors with juxtaposed side walls having a common insulated electrode.

6. An array of semiconductor detectors according to claim 3 and comprising at least one pair of adjacent detectors with juxtaposed side walls having separate insulated electrodes.

7. Apparatus according to claim 3 wherein said insulated electrode is floating, and is electrically isolated from said substrate and said electrodes formed thereon.

8. Apparatus according to claim 3 wherein said insulated electrode is grounded.

9. Apparatus according to claim 3 and wherein said electrode on second of said first and second opposite facing surfaces of said substrate comprises at least one cathode, and wherein said insulated electrode is substantially maintained at a potential relative to said at least one cathode, said potential being of any value and either polarity relative to the potential maintained between said pixellated anodes and said at least one cathode.

10. An array of at least one semiconductor detector according to claim 2, and wherein said electrodes, said electrical insulator and said insulated electrode operate generally in the manner of an insulated gate conduction channel.

11. An array of semiconductor detectors according to claim 2, and comprising at least one pair of adjacent detectors with juxtaposed side walls having a common insulated electrode.

12. An array of semiconductor detectors according to claim 2 and comprising at least one pair of adjacent detectors with juxtaposed side walls having separate insulated electrodes.

13. Apparatus according to claim 2 wherein said insulated electrode is floating, and is electrically isolated from said substrate surface and said electrodes formed thereon.

14. Apparatus according to claim 2 wherein said insulated electrode is grounded.

15. Apparatus according to claim 2 and wherein said electrode on second of said first and second opposite facing surfaces of said substrate comprises at least one cathode, and wherein said insulated electrode is substantially maintained at a potential relative to said at least one cathode, said potential being of any value and either polarity relative to the potential maintained between said pixellated anodes and said at least one cathode.

16. Apparatus according to claim 2 wherein said insulated electrode induces an electric field through said electrical insulator into said semiconductor material, thereby producing a space charge at a boundary between said electrical insulator and said substrate, said space charge causing a shift of trajectories of charge carriers away from said boundary and towards said pixellated anodes.

17. Apparatus according to claim 2 wherein said insulated electrode induces an electric field through said electrical insulator into said semiconductor material, thereby producing an electron depletion region surrounding a boundary between said electrical insulator and said substrate, said electron depletion region causing a shift of trajectories of charge carriers away from said boundary and towards said pixellated anodes.

18. Apparatus according to claim 2 wherein said insulated electrode is negatively biased and induces an electric field through said electrical insulator into said semiconductor material, thereby causing a shift of trajectories of charge carriers away from said boundary and towards said pixellated anodes.

19. An array of at least one semiconductor detector according to claim 1, and comprising:
   an electrical insulator formed on at least part of said at least one side wall; and
   an insulated electrode formed over at least part of said electrical insulator formed on at least part of said at least one side wall.

20. An array of at least one semiconductor detector according to claim 19, and wherein said electrodes, said electrical insulator and said insulated electrode operate generally in the manner of an insulated gate conduction channel.

21. An array of semiconductor detectors according to claim 19, and comprising at least one pair of adjacent detectors with juxtaposed side walls having a common insulated electrode.

22. An array of semiconductor detectors according to claim 3 and comprising at least one pair of adjacent detectors with juxtaposed side walls having separate insulated electrodes.

23. Apparatus according to claim 19 wherein said insulated electrode is floating, and is electrically isolated from said substrate and said electrodes formed thereon.

24. Apparatus according to claim 19 wherein said insulated electrode is grounded.

25. Apparatus according to claim 19 and wherein said electrode on second of said first and second opposite facing surfaces of said substrate comprises at least one cathode, and wherein said insulated electrode is substantially maintained at a potential relative to said at least one cathode, said potential being of any value and either polarity relative to the potential maintained between said electrode formed on first of said first and second opposite facing surfaces and said at least one cathode.

26. An array of at least one semiconductor detector according to claim 1, and wherein the chemical composition of said semiconductor material is $Cd_{1-x} Zn_x Te$, wherein x has any value from zero to unity.

27. An array of at least one semiconductor detector according to claim 1, and wherein said electrodes, said electrical insulator and said insulated electrode operate generally in the manner of an insulated gate conduction channel.

28. An array of semiconductor detectors according to claim 1, and comprising at least one pair of adjacent detectors with juxtaposed side walls having a common insulated electrode.

29. An array of semiconductor detectors according to claim 1 and comprising at least one pair of adjacent detectors with juxtaposed side walls having separate insulated electrodes.

30. Apparatus according to claim 1 wherein said insulated electrode is floating, and is electrically isolated from said substrate surface and said electrodes formed thereon.

31. Apparatus according to claim 1 wherein said insulated electrode is grounded.

32. Apparatus according to claim 1 and wherein said electrode on second of said first and second opposite facing surfaces of said substrate comprises at least one cathode, and wherein said insulated electrode is substantially maintained at a potential relative to said at least one cathode, said potential being of any value and either polarity relative to the potential maintained between said electrode formed on first of said first and second opposite facing surfaces and said at least one cathode.

33. Apparatus according to claim 1 wherein said insulated electrode induces an electric field through said electrical insulator into said semiconductor material, thereby producing a space charge at a boundary between said electrical insulator and said substrate, said space charge causing a shift of trajectories of charge carriers away from said boundary.

34. Apparatus according to claim 1 wherein said insulated electrode induces an electric field through said electrical insulator into said semiconductor material, thereby producing an electron depletion region surrounding a boundary between said electrical insulator and said substrate, said electron depletion region causing a shift of trajectories of charge carriers away from said boundary.

35. Apparatus according to claim 1 wherein said insulated electrode is negatively biased and induces an electric field through said electrical insulator into said semiconductor material, thereby causing a shift of trajectories of charge carriers away from said boundary.

36. An array of at least one semiconductor detector according to claim 1, and wherein said semiconductor material is essentially of a single type.

37. An array of at least one semiconductor detector according to claim 1, and wherein said insulated electrode is operative to deflect the trajectories of majority carriers associated with said semiconductor material, towards one of said electrodes.

38. A method for overcoming performance degradation in a semiconductor detector due to surface effects in a semiconductor substrate thereof, said detector comprising a substrate formed of a semiconductor material and defining a detector surface comprising first and second opposite facing surfaces and at least one side wall, and also comprising electrodes operative as anodes and cathodes of said detector formed on said first and second opposite facing surfaces of the substrate, said electrodes forming a potential gradient essentially between said first and second opposite facing surfaces, the method comprising the steps of:
   forming an electrical insulator on at least part of said detector surface; and
   forming an insulated electrode of essentially conductive material on at least part of said electrical insulator.

39. A method according to claim 38 and comprising the step of inducing an electric field through said electrical insulator into said semiconductor material, thereby producing a space charge at a boundary between said electrical insulator and said substrate, said space charge causing a shift of trajectories of charge carriers away from said boundary.

40. A method according to claim 38 and comprising the step of inducing an electric field through said electrical insulator into said semiconductor material, thereby producing an electron depletion region surrounding said boundary between said electrical insulator and said substrate, said electron depletion region causing a shift of trajectories of charge carriers away from said boundary.

41. A method according to claim 38 and comprising the step of applying a negative potential to said insulating electrode thereby inducing an electric field through said electrical insulator into said semiconductor material, said electric field causing a shift of trajectories of charge carriers away from said insulated electrode.

42. A method according to claim 38 and also comprising the step of inducing an electric field from said insulated electrode through said electrical insulator into said semiconductor material, thereby attracting charge carriers towards said insulated electrode and producing a space charge at a boundary between said electrical insulator and said substrate, and an electron depletion region surrounding said boundary between said electrical insulator and said substrate, said space charge reaching a level such that the addition of further charge by the attraction of charge carriers towards said insulated electrode is such that said accumulated space charge produces an electric field having the same intensity but opposite orientation to the field creating the space charge, such that the space charge is self-regulated to produce the minimum electrical force needed to shift said trajectories of charge carriers away from said boundary.

43. A method for overcoming performance degradation in a semiconductor detector due to surface effects of a semiconductor substrate thereof, said detector comprising a substrate formed of a semiconductor material and defining first and second opposite facing surfaces and at least one side wall, and also comprising electrodes operative as anodes and cathodes of said detector formed on said first and second opposite facing surfaces of the substrate, said electrodes forming a potential gradient essentially between said first and second opposite facing surfaces, the electrodes formed on first of said first and second opposite facing surfaces comprising an array of mutually spaced pixellated anodes defining interstices therebetween, the method comprising the steps of:

forming an electrical insulator on said substrate at locations substantially in the interstices between said mutually spaced pixellated anodes; and forming an insulated electrode of essentially conductive material onto at least part of said electrical insulator.

44. A method according to claim 43 and comprising the step of inducing an electric field through said electrical insulator into said semiconductor material, thereby producing a space charge at a boundary between said electrical insulator and said substrate, said space charge causing a shift of trajectories of charge carriers away from said boundary and towards said pixellated anodes.

45. A method according to claim 43 and comprising the step of inducing an electric field through said electrical insulator into said semiconductor material, thereby producing an electron depletion region surrounding said boundary between said electrical insulator and said substrate, said electron depletion region causing a shift of trajectories of charge carriers towards said pixellated anodes.

46. A method according to claim 43 and comprising the step of applying a negative potential to said insulating electrode thereby inducing an electric field through said electrical insulator into said semiconductor material, said electric field causing a shift of trajectories of charge carriers away from said insulated electrode and towards said pixellated anodes.

47. A method according to claim 43 and also comprising the step of inducing an electric field from said insulated electrode through said electrical insulator into said semiconductor material, thereby attracting charge carriers towards said insulated electrode and producing a space charge at a boundary between said electrical insulator and said substrate, and an electron depletion region surrounding said boundary between said electrical insulator and said substrate, said space charge reaching a level such that the addition of further charge by the attraction of charge carriers towards said insulated electrode is such that said accumulated space charge produces an electric field having the same intensity but opposite orientation to the field creating the space charge, such that the space charge is self-regulated to produce the minimum electrical force needed to shift said trajectories of charge carriers away from said boundary and towards said pixellated anodes.

48. A method for overcoming performance degradation in a semiconductor detector due to surface effects in a semiconductor substrate thereof, said detector comprising a substrate formed of a semiconductor material and defining a detector surface comprising first and second opposite facing surfaces and at least one side wall, and also comprising electrodes formed on said first and second opposite facing surfaces of the substrate, the method comprising the steps of:

forming an electrical insulator on at least part of said at least one side wall; and forming an insulated electrode over at least part of said electrical insulator formed on at least part of said at least one side wall.

49. A method for overcoming performance degradation in a semiconductor detector due to surface effects of a semiconductor substrate thereof, said detector comprising a substrate formed of a semiconductor material and defining first and second opposite facing surfaces and at least one side wall, and also comprising electrodes formed on first and second opposite facing surfaces of the substrate, the electrodes formed on first of said first and second opposite facing surfaces comprising an array of mutually spaced pixellated anodes defining interstices therebetween, the method comprising the steps of:

forming an electrical insulator on at least part of said at least one side wall; and forming an insulated electrode over at least part of said electrical insulator formed on at least part of said at least one side wall.

* * * * *